United States Patent
Kadayam Viswanathan et al.

(10) Patent No.: US 10,724,975 B2
(45) Date of Patent: Jul. 28, 2020

(54) APPARATUS AND METHODS FOR DETERMINING PROPERTIES OF LIQUID-BEARING SOLIDS USING NUCLEAR MAGNETIC RESONANCE

(71) Applicant: SCHLUMBERGER TECHNOLOGY CORPORATION, Sugar Land, TX (US)

(72) Inventors: Ravinath Kausik Kadayam Viswanathan, Sharon, MA (US); Yiqiao Song, Newton Center, MA (US)

(73) Assignee: Schlumberger Technology Corporation, Sugar Land, TX (US)

(*) Notice: Subject to any disclaimer, the term of this patent is extended or adjusted under 35 U.S.C. 154(b) by 399 days.

(21) Appl. No.: 15/675,555

(22) Filed: Aug. 11, 2017

(65) Prior Publication Data

US 2019/0049397 A1 Feb. 14, 2019

(51) Int. Cl.
*G01N 24/08* (2006.01)
*G01V 3/32* (2006.01)
(Continued)

(52) U.S. Cl.
CPC ....... *G01N 24/081* (2013.01); *G01R 33/4641* (2013.01); *G01V 3/32* (2013.01); *G01R 33/448* (2013.01)

(58) Field of Classification Search
CPC ............... G01N 24/081; G01R 33/448; G01R 33/4641; G01R 33/445; G01R 33/5615; G01R 33/5617; G01V 3/32
See application file for complete search history.

(56) References Cited

U.S. PATENT DOCUMENTS

| 4,728,892 A | 3/1988 | Vinegar et al. |
| 5,023,551 A | 6/1991 | Kleinberg et al. |

(Continued)

FOREIGN PATENT DOCUMENTS

| EP | 0478632 A1 | 4/1992 |
| JP | 2014145737 A | 8/2014 |
| WO | 2016061335 A1 | 4/2016 |

OTHER PUBLICATIONS

Andrew, E. R., "Magic Angle Spinning", in Solid State NMR Studies of Biopolymers, John Wiley & Sons, 2010, pp. 83-97.
(Continued)

*Primary Examiner* — Rishi R Patel

(57) ABSTRACT

Nuclear magnetic resonance (NMR) methods and apparatus are provided for investigating a sample utilizing NMR pulse sequences having solid state and CPMG pulse sequence portions. Various embodiments of solid state pulse sequences may be utilized including two-dimensional (re-petitive) line-narrowing sequences. The hydrogen content of a solid portion of the sample may be determined by using one or more echoes resulting from the solid state sequence portion of the pulse sequence to establish a total organic hydrogen content of the sample, and by using a CPMG echo train to establish a fluid organic hydrogen content, and by subtracting one from the other to obtain the hydrogen content of the sample's solid portion. Additionally, or alternatively, the $T_2$ values obtained from the line-narrowing and CPMG pulse sequences can be compared by plotting to obtain information regarding a characteristic of the sample. The NMR pulse sequence may also include a $T_1$ portion.

32 Claims, 17 Drawing Sheets

(51) Int. Cl.
   *G01R 33/46* (2006.01)
   *G01R 33/44* (2006.01)

(56) References Cited

U.S. PATENT DOCUMENTS

| | | | | |
|---|---|---|---|---|
| 5,254,949 | A * | 10/1993 | McDonald | G01R 33/4816 324/309 |
| 5,539,309 | A * | 7/1996 | Van Wyk | G01R 33/44 324/303 |
| 8,773,126 | B2 | 7/2014 | Kuge et al. | |
| 2005/0248342 | A1 | 11/2005 | Rottengatter et al. | |
| 2005/0270023 | A1 * | 12/2005 | Freedman | G01V 3/32 324/303 |
| 2010/0072995 | A1 | 3/2010 | Nishiyama | |
| 2011/0050227 | A1 | 3/2011 | Barrett et al. | |
| 2012/0273193 | A1 | 11/2012 | Sen et al. | |
| 2014/0266194 | A1 | 9/2014 | Corkery et al. | |
| 2015/0268323 | A1 * | 9/2015 | Song | G01V 3/32 324/303 |
| 2017/0176361 | A1 | 6/2017 | Shao et al. | |
| 2017/0205527 | A1 | 7/2017 | Coman | |

OTHER PUBLICATIONS

Boden, N. et al., "An NMR "solid" echo experiment for the direct measurement of the dipolar interactions between spin-1/2 pairs in solids", Chemical Physics Letters, 1973, 21(3), pp. 538-540.
Boden, N. et al., "NMR "solid" echoes in systems of loosely-coupled spin-12 pairs", Physics Letters A, 1974, 46(5), pp. 329-330.
Carr, H. Y. et al, "Effects of Diffusion on Free Precession in Nuclear Magnetic Resonance Experiments", Physical Review, 94(#), 1954, 13 pages.
Dementyev, A. E. et al., "Anomalies in the NMR of silicon: Unexpected spin echoes in a dilute dipolar solid", Physical Review B, 2003, 68, pp. 153302-1 through 153302-4.
Dong, Y. et al., "Controlling Coherence Using the Internal Structure of Hard $\pi$ pulses", Physical Review Letters, 2008, 100, 247601-1 through 247601-4.
Hahn, E. L., "Spin Echoes", Physical Review, 1950, 80(4), pp. 22 pages.
Hoult, D. I., "Fast recovery, high sensitivity NMR probe and preamplifier for low frequencies", Review of Scientific Instruments, 1979, 50(2), pp. 193-200.
Le Doan, T. V. et al., "Green River Oil Shale Pyrolysis: Semi-Open Conditions", Energy & Fuels, 2013 27(11), pp. 6447, 2013.
Li D. et al.,"Generating Unexpected Spin Echoes in Dipolar Solids with $\pi$ pulses", Physical Review Letters, 2007, 98, 190401-1 through 190401-4.
Li, D. et al., "Intrinsic origin of spin echoes in dipolar solids generated by strong $\pi$ pulses", Physical Review B, 2008, 77(1), pp. 214306-1 through 214306-26.
Meiboom, S. et al., "Modified Spin-Echo Method for Measuring Nuclear Relaxation Times", Review of Scientific Instruments 29, 1958, pp. 688-691.
Pines, A. et al., "Homogeneous and Inhomogeneous Nuclear Spin Echoes in Solids", Journal of Magnetic Resonance, 1969, 6, pp. 457-465.
Takegoshi, K. et al., "A "Magic Echo" Pulse Sequence for the High-Resolution NMR Spectra of Abundant Spins in Solids", Chemical Physics Letters, 1985, 116(2-3), pp. 100-104.
Waugh, J. S. et al., "Approach to High_Resolution NMR in Solids", Physical Review Letters, 1968, 20(5), 4 pages.
Waugh, J. S. et al., "Multiple Spin Echoes in Dipolar Solids", Physical Review , 1967, 162(2), 9 pages.
Search Report and Written Opinion of International Patent Application No. PCT/US1018/045312 dated Nov. 14, 2018, 18 pages.
Search Report and Written Opinion of International Patent Application No. PCT/US2018/045313 dated Dec. 18, 2018, 12 pages.
Office Action received in U.S. Appl. No. 15/675,575 dated Jan. 22, 2020, 17 pages.

* cited by examiner

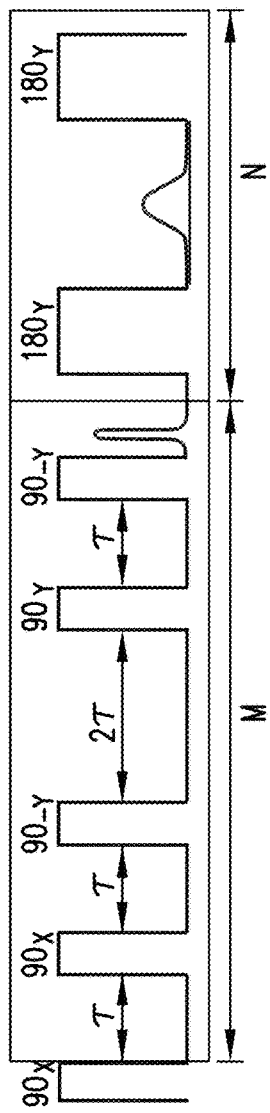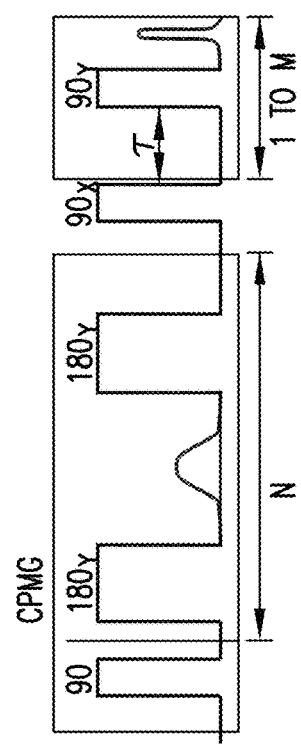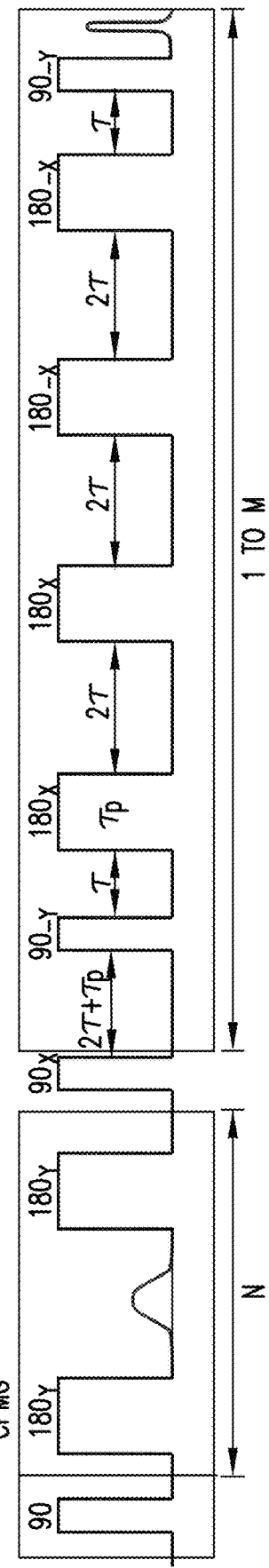

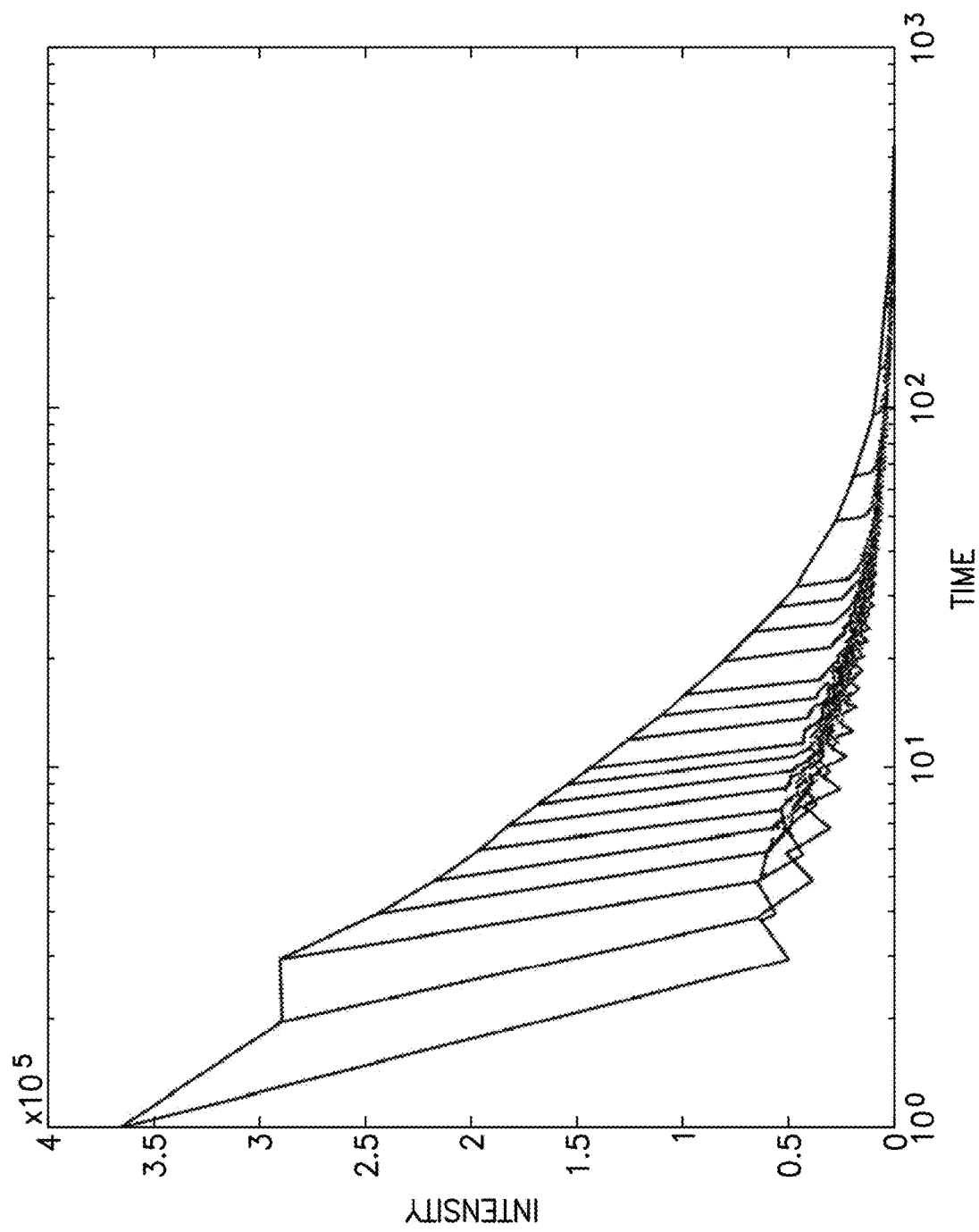

APPARATUS AND METHODS FOR DETERMINING PROPERTIES OF LIQUID-BEARING SOLIDS USING NUCLEAR MAGNETIC RESONANCE

CROSS REFERENCE TO RELATED APPLICATION

The present application is related to U.S. application Ser. No. 15/675,575, filed Aug. 11, 2017, and entitled "APPARATUS AND METHODS FOR DETERMINING PROPERTIES OF HYDROGEN-CONTAINING SAMPLES USING NUCLEAR MAGNETIC RESONANCE", which is herein incorporated by reference.

TECHNICAL FIELD

The subject disclosure relates to the use of nuclear magnetic resonance (NMR) apparatus and methods for determining characteristics of substances. More particularly, the subject disclosure relates to apparatus and methods for determining the properties of liquid-bearing solids such as shale using NMR tools, and is particularly useful downhole, although the disclosure is not limited thereto.

BACKGROUND

Nuclear magnetic resonance (NMR) technologies can be useful in a wide variety of applications. For example, in the field of oilfield services, NMR logging tools can provide information regarding fluids in a formation as well as porosity of the formation. Such information can be combined with data collected using other technologies to better inform engineers as they engage in various pursuits including, for example, formation evaluation, completion engineering, geological characterization, reservoir production, etc.

NMR logging tools can be introduced into a wellbore in a variety of ways. For example, an NMR logging tool can be included in a bottom hole assembly and take measurements during a drilling operation. NMR logging tools can also be lowered into a wellbore using other technologies, such as wireline technologies.

General background of nuclear magnetic resonance (NMR) well logging is set forth, for example, in U.S. Pat. No. 5,023,551. Briefly, in conventional NMR operation, the spins of nuclei align themselves along an externally applied static magnetic field. This equilibrium situation can be disturbed by a pulse of an oscillating magnetic field (e.g. a radio frequency (RF) pulse), which tips the spins away from the static field direction. After tipping, two things occur simultaneously. First, the spins precess around the static field at the Larmor frequency, given by $\omega_0 = \gamma \times B_0$, where $B_0$ is the strength of the static field and $\gamma$ is the gyromagnetic ratio. Second, the spins return to the equilibrium direction according to a decay time $T_1$, which is called the longitudinal relaxation time constant or spin lattice relaxation time constant. For hydrogen nuclei, $\gamma/2\pi = 4258$ Hz/Gauss, so, for example, for a static field of 235 Gauss, the frequency of precession would be 1 MHz. Also associated with the spin of molecular nuclei is a second relaxation time constant, $T_2$, called the transverse relaxation time constant or spin-spin relaxation time constant. At the end of a ninety degree tipping pulse, all the spins are pointed in a common direction perpendicular to the static field, and they all precess at the Larmor frequency. The net processing magnetization decays with a time constant $T_2$ because the individual spins rotate at different rates and lose their common phase. At the molecular level, dephasing is caused by random motions of the spins. The magnetic fields of neighboring spins and nearby paramagnetic centers appear as randomly fluctuating magnetic fields to the spins in random motion. In an inhomogeneous field, spins at different locations precess at different rates. Therefore, in addition to the molecular spin-spin relaxation of fluids, spatial inhomogeneities of the applied field also cause dephasing. Spatial inhomogeneities in the field can be due to microscopic inhomogeneities in the magnetic susceptibility of rock grains or due to the macroscopic features of the magnet.

A widely used technique for acquiring NMR data, both in the laboratory and in well logging, uses an RF pulse sequence known as the CPMG (Carr-Purcell-Meiboom-Gill) sequence. As is well known, after a wait time that precedes each pulse sequence, a ninety degree pulse causes the spins to start processing. Then a one-hundred-eighty degree pulse is applied to cause the spins which are dephasing in the transverse plane to refocus. By repeatedly refocusing the spins using one-hundred-eighty-degree pulses, a series of "spin echoes" appear, and the train of echoes is measured and processed. The transverse relaxation time constant, $T_2$, or the distribution of multiple $T_2$s, can be reliably obtained using this technique. In well logging, the CPMG sequence is traditionally executed using a set of equipment located "downhole" in a wellbore (in situ). While performing the CPMG sequence in situ allows for relatively rapid data gathering, limitations of the equipment and the environment can make it difficult to obtain accurate downhole data. For example, due to the limits on equipment power, design constraints and downhole conditions, the signal to noise ratio (SNR) for an in situ CPMG sequence remains low. In addition, while the CPMG sequence may be useful in measuring a $T_2$ distribution which correlates with the properties of a reservoir fluid, the CPMG sequence is not very well suited for studying solid samples with strong dipolar interactions because the pi ($\pi$) pulse rotations that make up the CPMG sequence do not refocus the homonuclear dipole-dipole interaction between nearby hydrogen atoms.

More particularly, solids are characterized by short transverse coherence times due to the presence of molecular interactions (which are generally averaged out in liquids due to Brownian motions). These anisotropic molecular interactions, such as dipole-dipole interactions, result in broadening of the NMR spectral lines (peaks), or shortening of the transverse relaxation times. For example, the Hamiltonian for the magnetic dipole-dipole interaction between two nuclear spins $I_1$ and $I_2$ separated by an inter-nuclear distance $r$ is given by $$D = \frac{\mu_0 \gamma_1 \gamma_1 h^2}{16\pi^3} \left[ \frac{(\overline{I_1} \; \overline{I_1})}{r^3} - \frac{3(\overline{I_1} \; r)(\overline{I_2} \; r)}{r^5} \right], \quad (1)$$

where $\mu_0$ is the vacuum permeability, and $h$ is the Plank's constant. When multiple hydrogen atoms are present, the total dipolar Hamiltonian is a sum of equation (1) for all pairs. In the laboratory, the line broadening due to the dipolar coupling in solids can be partly overcome by using Magic Angle Spinning (MAS) technique. See, e.g., E. R. Andrew, "Magic Angle Spinning", *Solid Slate NMR Studies of Biopolymers*, John Wiley & Sons. pp. 83-97 (2010). This technique involves averaging out of the interactions by rapidly spinning the samples along an axis at a particular angle (~54°) relative to $B_0$, resulting in a drastic reduction in the line widths. MAS has been extensively used for the study of oilfield solids and viscous fluids such as kerogen, bitumen and heavy oils in laboratories. However, this technique cannot be implemented downhole in well-logging.

In NMR well-logging tools, depending upon the tool, the shortest echo time available may be between 200 μs and 1050 μs. Since the relaxation time of shale samples containing kerogen can be as short as 100 μs due to strong dipolar interaction, such a short relaxation component cannot be accurately measured by the current logging tools.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

Illustrative embodiments of the present disclosure include methods and apparatus that subject a sample to an NMR pulse sequence that incorporates a solid state pulse sequence followed by a CPMG sequence. The solid state pulse sequence produces an echo that does not suffer from dipolar interaction and thus, the signal of this first echo is taken as a representation of the total hydrogen content of the sample. The CPMG sequence then produces an echo train that is used, via conventional interpretation, to find the hydrogen content of the sample associated with fluids (liquids and gases) in the sample. In some embodiments, the difference between the fluid (hydrogen) content of the sample obtained from processing information related to the CPMG sequence echoes and the total hydrogen content of the sample obtained from processing the first echo information is used to obtain an indication of the hydrogen content of the solid portion of the sample. Information regarding the hydrogen content of the solid portion of the sample may be used to find, among other things, the maturity of the formation.

In other embodiments the NMR pulse sequence incorporates a 2D line-narrowing pulse sequence followed by a CPMG pulse sequence. The echoes produced by the line-narrowing pulse sequence and the echoes produced by the CPMG pulse sequence may be processed to obtain indications of the hydrogen content of the sample and to distinguish between hydrogen-containing species in the sample.

Additional aspects, embodiments, objects and advantages of the disclosed apparatus and methods may be understood with reference to the following detailed description taken in conjunction with the provided drawings.

BRIEF DESCRIPTION OF THE DRAWINGS

FIGS. 5a-5h are diagrams of eight different "two-dimensional" NMR pulse sequences that each incorporate a variable block of line-narrowing pulse sequences and a CPMG sequence, with FIGS. 5a-5d including a variable block of line-narrowing pulse sequences followed by a CPMG sequence, and FIGS. 5e-5h including a CPMG sequence followed by a variable block of line-narrowing pulse sequences.

FIGS. 6a and 6b are plots respectively showing hypothetical echo and processed inversion results from the pulse sequence of FIG. 5a.

DETAILED DESCRIPTION

The particulars shown herein are by way of example and for purposes of illustrative discussion of the examples of the subject disclosure only and are presented in the cause of providing what is believed to be the most useful and readily understood description of the principles and conceptual aspects of the subject disclosure. In this regard, no attempt is made to show details in more detail than is necessary, the description taken with the drawings making apparent to those skilled in the art how the several forms of the subject disclosure may be embodied in practice. Furthermore, like reference numbers and designations in the various drawings indicate like elements.

Figure 1:
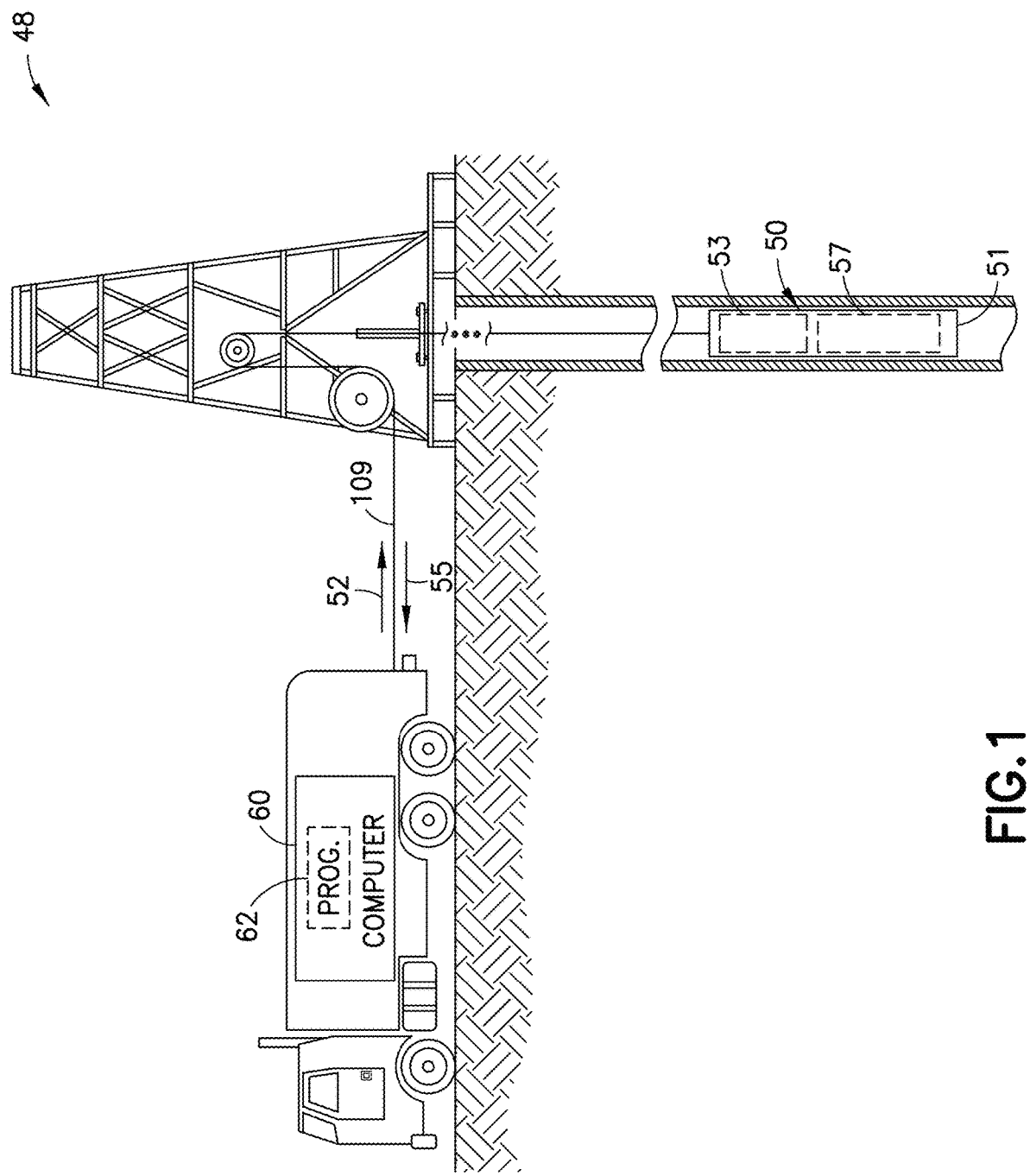
FIG. 1 is a block diagram of a NMR borehole logging tool system.

An NMR measurement system 48 is seen in FIG. 1 to include an NMR wireline tool 50 that may be programmed with a one or more NMR measurement sequences described hereinafter. In one embodiment, the tool 50 is constructed to receive logging sequence data 52 that defines an NMR measurement sequence to be performed by the tool. The data 52, in turn, may include state descriptors, each of which indicates a state of the NMR measurement sequence during an associated time slice, or interval, of the sequence. Thus, due to this arrangement, the tool 50 may generate the NMR measurement sequence in response to the state descriptors, as described below. In some embodiments, the state descriptors may be generated by a processor or computer 60 (located at the surface of the well, for example), which may include associated memory 62 that communicates the resultant data 52 via a wireline cable 109 to the tool 50, as described below. The computer 60 may also receive magnetic resonance (MR) data 55 from the tool 50 via the wireline 109 for processing as described hereinafter. The data 52 may be loaded into the tool 50 via other techniques (via a serial link before the tool 50 is lowered downhole, for example) other than the above-described wireline technique.

Each state descriptor is associated with a particular time interval of the NMR measurement sequence and indicates the logical states of various signals that control the tool 50 during that time interval. For example, a particular state descriptor may indicate the state of a digital signal that establishes the frequency of a carrier signal of transmitted radio frequency (RF) pulses, and the same state descriptor may indicate the state of another digital signal that indicates a phase of the carrier signal, as just a few examples. As another example, a particular state descriptor may indicate the logic levels of voltages that are used to operate switches of the tool 50 to generate the NMR measurement sequence, as described below. In some embodiments, each state descriptor may also indicate the duration of the associated time interval.

The tool 50 may store state descriptors for several NMR measurements. In this manner, the sequence(s) to be used may be selected before the tool 50 is lowered downhole. Furthermore, due to the ability of tool 50 to store state descriptors for multiple NMR measurement sequences, the tool 50 may use different sequences downhole.

The tool 50 includes a body 51 that can have one or more magnets and circuitry 53. The magnets are configured to generate a static field and the circuitry 53 is electrically coupled to an NMR sensor 57 of the tool 50. As described below, the circuitry receives the data 52 from the wireline 109 and interacts with the sensor 57 to perform a given NMR measurement sequence and also communicates the NMR data 55 (via the wireline 109) to the computer 60 for processing.

Figure 2:
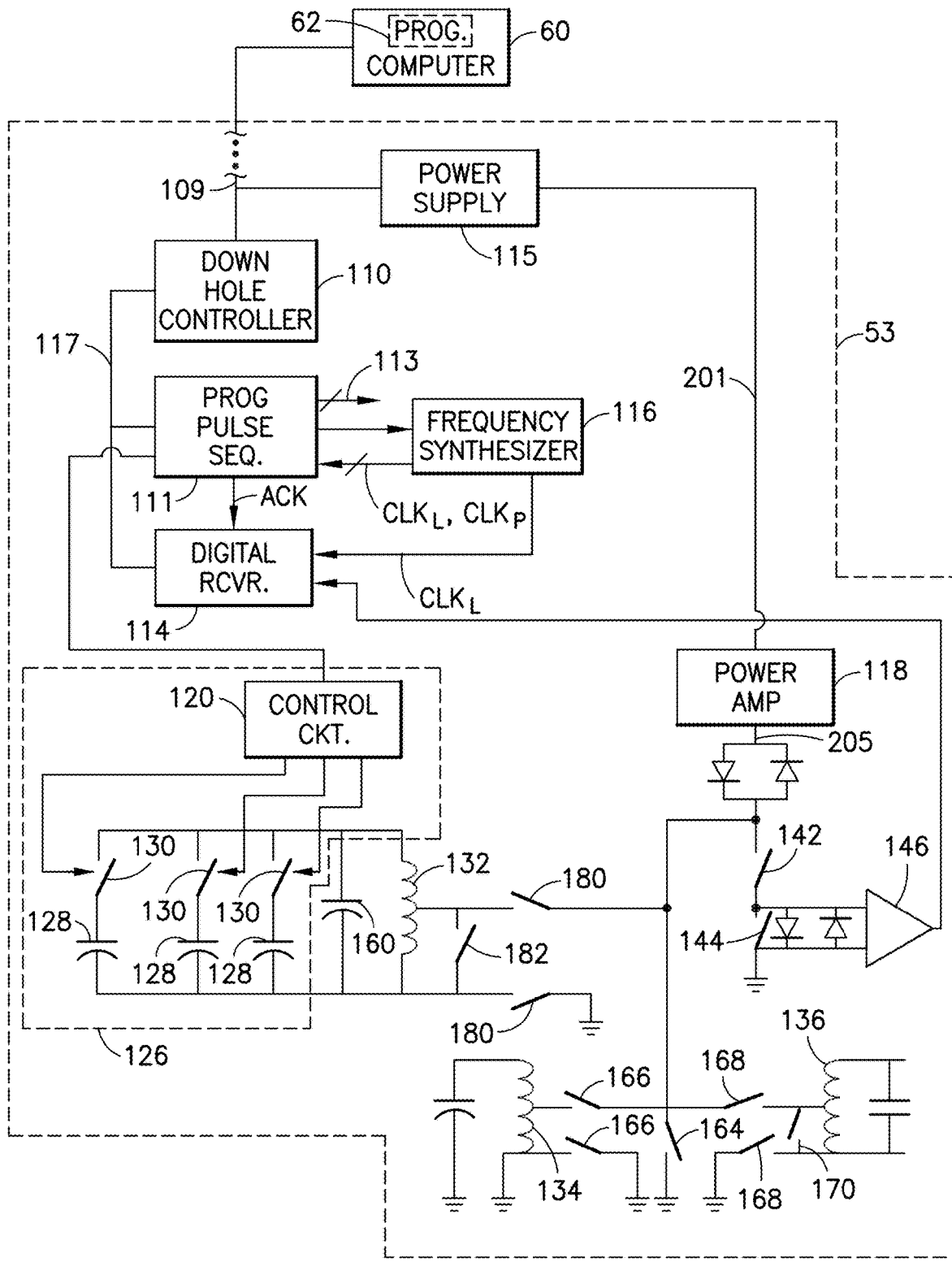
FIG. 2 is a schematic diagram of circuitry of an NMR borehole logging tool.

Referring to FIG. 2, in some embodiments, the circuitry 53 communicates with the computer 60 to perform a given NMR measurement sequence such as described hereinafter with respect to FIGS. 3a-3d and FIGS. 5a-5d based on the state descriptors. To accomplish this, a downhole controller 110 is coupled to the wireline 109 to communicate with the computer 60 to receive the data 52 and provide the resultant state descriptors to a programmable pulse sequencer 111. The pulse sequencer 111, in turn, executes the state descriptors to generate signals (on signal lines 113) that control the NMR measurement sequence. In the course of the NMR measurement sequence, the pulse sequencer 111 may perform the following actions: generate signals that operate a power amplifier 118 to generate RF transmission pulses, communicate (via a serial bus) with a resonance tuning circuit 120 to control the resonance frequency of a main receiving antenna 132 (represented by an inductor), control (via an ACQ signal) the activation of digital receiver circuitry 114, control the activation of transmission circuitry and generate signals to control various switches of the circuitry 53, as further described below.

Besides the pulse sequencer 111, the circuitry 53 includes a frequency synthesizer 116 that is coupled to the pulse sequencer 111 to generate clock signals for the circuitry 53 based on executed state descriptors. For example, the frequency synthesizer 116 may generate clock signals based on the RF frequency and phase that are indicated by an executed state descriptor. The pulse sequencer 111 may then use one of these clock signals to generate an RF transmission pulse by interacting with the power amplifier 118. A bus 117 establishes communication between the digital receiver 114, the downhole controller 110 and the pulse sequencer 111. The circuitry 53 is coupled to multiple antennae 132, 134 and 136 of an NMR sensor 57. The main antenna 132 may be used to transmit RF pulses and receive spin echo signals. In some embodiments, the other antennae 134 and 136 are used to receive spin echo signals. The antennae 132, 134 and 136 may be distributed along the length of the sensor 57.

The generation of a transmission pulse (a refocusing pulse or a tipping pulse, as examples) may occur in the following manner. First, the pulse sequencer 111 executes a particular state descriptor that indicates (via a signal called RF) that an RF pulse is to be generated during the next NMR measurement state. In this manner, during the next NMR measurement state, the pulse sequencer 111 uses a clock signal that is provided by the frequency synthesizer to generate signals to produce an RF pulse at the output of the power amplifier 118. During the next state, the pulse sequencer 111 executes the next state descriptor that causes the pulse sequencer 111 to activate the appropriate switches to couple the output terminal of the power amplifier 118 to one of the three antennae (the antenna 132, 134 or 136) and isolate the remaining two antennae. The execution of this descriptor also causes the pulse sequencer 111 to assert a signal that activates switch 144 to short out the input terminals of a preamplifier 146 of the receiving circuitry; deassert a signal that deactivates switch 142 to decouple the preamplifier 146 from the output terminal of the power amplifier 118; and deassert the ACQ signal to disable the digital receiver 114 (that receives an output signal from the preamplifier 146), as just a few examples of the signals that may be controlled by a particular state descriptor.

To receive a spin echo signal, the appropriate state descriptor causes the ACQ signal to be asserted to enable the digital receiver 114; causes the BS signal to be deasserted to enable reception of a signal by the preamplifier 146; and causes the assertion/deassertion of the appropriate switches to couple the main antenna 132 to the input terminals of the preamplifier 146 while isolating the remaining antennae 134 and 136 from the rest of the circuitry 53. For applications to reservoir rocks, it is often desirable to use very short echo times, such as 200 us, 100 us or even shorter. The use of active RF switches, Q-damping circuits, or actively damped receiver circuit can effectively reduce the system ringing and shortens the echo time. See, D. I. Hoult, "Fast recovery, high sensitivity NMR probe and preamplifier for low frequencies", *Review of Scientific Instruments*, Vol. 58, page 193 (1979).

As depicted in FIG. 2, switches 180, switches 168 and switches 166 are controlled via signals that are generated from the execution of the state descriptors to selectively couple the antennae 132, 136 and 134, respectively, to an output terminal of the power amplifier 118. Switches 182, 164 and 170 are controlled via signals that are generated from the execution of the state descriptors to selectively shunt coils of the antennae 132, 134 and 136, respectively, to ground.

In one aspect, it will be appreciated that circuitry other than shown in FIG. 2, and systems other than shown in FIG. 1 may be implemented to generate NMR pulse sequences and detect signals (i.e., measure a response) resulting from the interaction of the NMR pulse sequences and the formation.

Turning now to FIGS. 3a-3h, eight different advantageous pulse sequences are provided. Each of the pulse sequences incorporates a solid state pulse sequence portion which produces an echo that does not suffer from dipolar interaction, and a CPMG sequence portion. Each of the pulse sequences may be implemented by the system and apparatus of FIGS. 1 and 2, or with other equipment.

Figure 3A:
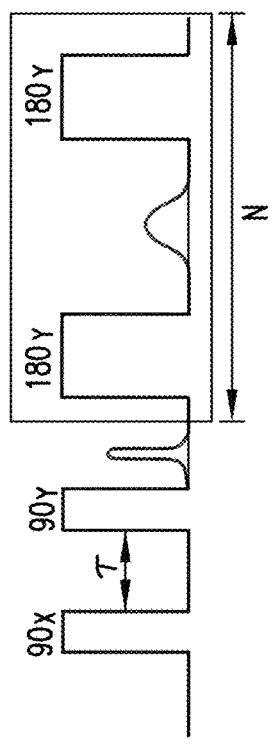
FIGS. 3a-3h are diagrams of eight different NMR pulse sequences that incorporate a solid state pulse sequence and a CPMG sequence, with FIGS. 3a-3d including a solid state pulse sequence followed by a CPMG sequence, and FIGS. 3e-3h including a CPMG sequence followed by a solid state pulse sequence.

More particularly, FIG. 3a shows a solid state pulse sequence portion known as a single solid echo pulse sequence which is followed by a CPMG pulse sequence portion. The single solid echo pulse sequence portion includes a first ninety degree excitation pulse (90x) followed after a wait period τ by a second ninety degree excitation pulse (90y) which may be considered the beginning of the CPMG pulse sequence. A first echo is recorded after the second ninety degree excitation pulse. According to the CPMG pulse sequence portion, a fixed time (e.g., τ) after the ninety degree pulse beginning the CPMG sequence, an NMR refocusing pulse (180y) is applied to rotate the processing spins through an angle of 180°. A series of N spaced refocusing pulses are utilized at 2τ, with echo measurements being made between the 180° refocusing pulses. If desired, the time τ between the second ninety degree excitation pulse and the first refocusing pulse of the CPMG pulse sequence portion may be different than the time τ between the ninety degree excitation pulses.

Figure 3B:
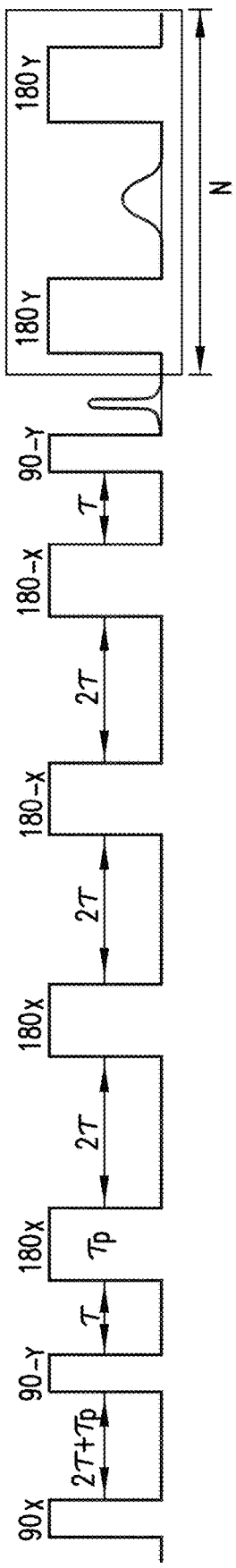

FIG. 3b shows another embodiment of a pulse sequence utilizing a solid state pulse sequence portion known as a one shot quadratic echo pulse sequence which is followed by a CPMG pulse sequence portion. The one shot quadratic echo pulse sequence portion involves a first ninety degree excitation pulse (90x) followed after a time period of 2τ+$τ_p$ by a second ninety degree excitation pulse (90-y), followed after a time period τ by an 180 degree pulse (180x) of length $τ_p$, followed after a time period 2τ by three 180 degree pulses (180x, 180-x, 180-x) each spaced by a time period 2τ, and followed by another ninety degree excitation pulse (90-y) which may be considered the beginning of the CPMG pulse sequence portion. A first echo is recorded after this ninety degree pulse. The CPMG pulse sequence portion continues as previously described with respect to FIG. 3a with additional echoes (the CPMG "echo train") being recorded.

Figure 3C:
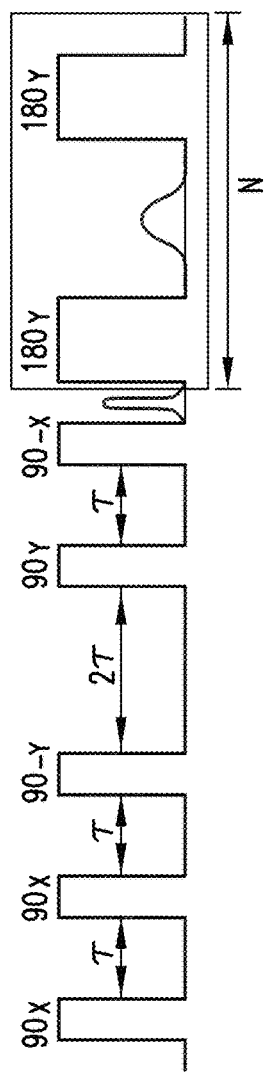

FIG. 3c shows another embodiment of a pulse sequence utilizing a solid state pulse sequence portion known as the WAHUHA pulse sequence which is followed by a CPMG pulse sequence portion. The WAHUHA pulse sequence portion involves a first ninety degree excitation pulse (90x) followed after a period of time τ by a second ninety degree excitation pulse (90x), followed after a period of time τ by a third ninety degree excitation pulse (90-y), followed after a period of time 2τ by a fourth ninety degree excitation pulse (90-y), followed after a period of time τ by a fifth ninety degree excitation pulse (90-y) which may be considered the beginning of the CPMG pulse sequence portion. A first echo is recorded after this fifth ninety degree pulse. The CPMG pulse sequence portion continues as previously described with respect to FIG. 3a with additional echoes (the CPMG "echo train") being recorded.

Figure 3D:
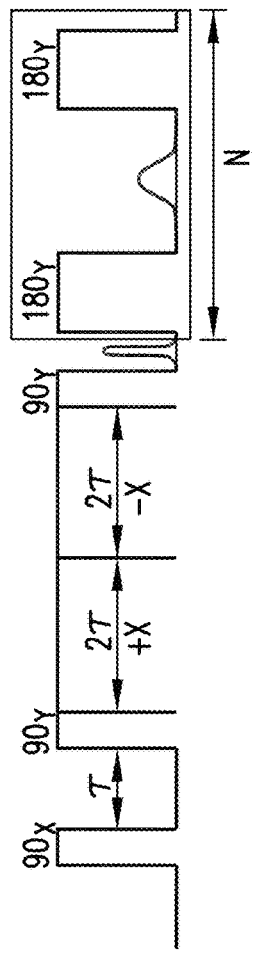

FIG. 3d shows another embodiment of a pulse sequence utilizing a solid state pulse sequence portion known as the Magic echo pulse sequence which is followed by a CPMG pulse sequence portion. The Magic echo pulse sequence portion involves a first ninety degree excitation pulse (90x) followed after a period of time τ by a second ninety degree excitation pulse (90y), which is followed after a period of 4 τ (during which time spin-locking +x and −x pulses are provided) by another ninety degree excitation pulse (90y) which may be considered the beginning of the CPMG pulse sequence portion. A first echo is recorded after this ninety degree pulse. The CPMG pulse sequence portion continues as previously described with respect to FIG. 3a with additional echoes (the CPMG "echo train") being recorded.

Figure 3E:
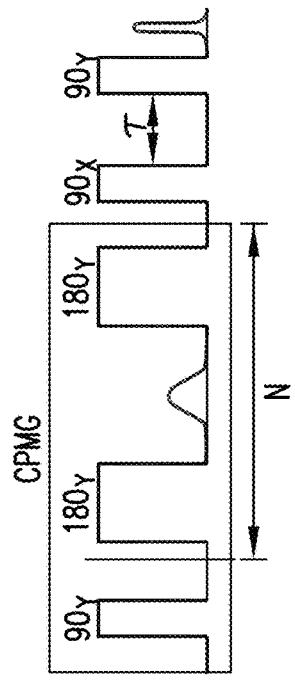

FIGS. 3e-3h show embodiments similar to FIGS. 3a-3d, except that the CPMG sequence portion is utilized first, and solid state pulse sequence portion follows the CPMG portion. Thus, FIG. 3e shows a CMPG pulse sequence including a ninety degree excitation pulse (90y) followed by a series of NMR of N refocusing pulses (180y), with echo measurements being made between the 180° refocusing pulses. After the CPMG sequence, a solid echo pulse sequence portion includes a first ninety degree excitation pulse (90x) followed after a wait period τ by a second ninety degree excitation pulse (90y). A first echo is recorded after the second ninety degree excitation pulse of the solid echo pulse sequence portion.

Figure 3F:
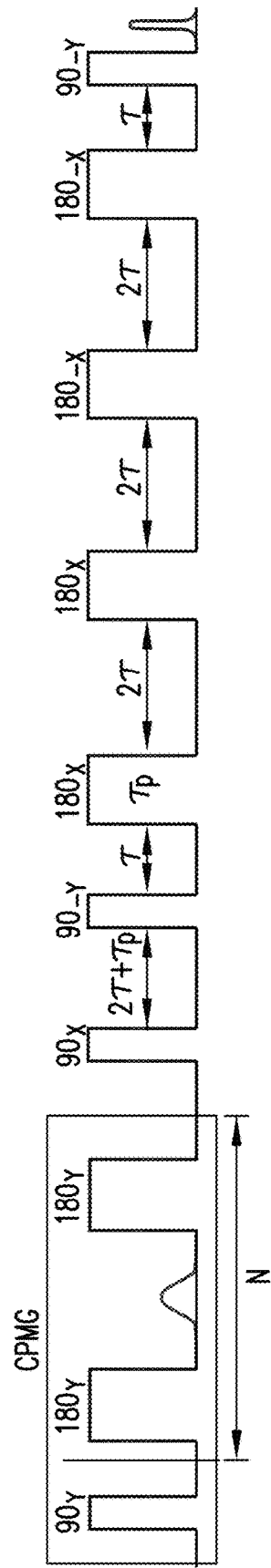

FIG. 3f shows a pulse sequence that is similar to the pulse sequence of FIG. 3b except that the CPMG sequence portion is utilized first, and the solid state pulse sequence portion follows the CPMG portion. Thus, FIG. 3f shows a CMPG pulse sequence including a ninety degree excitation pulse (90y) followed by a series of NMR of N refocusing pulses (180y), with echo measurements being made between the 180° refocusing pulses. After the CPMG sequence, a solid state pulse sequence portion includes a "one shot quadratic echo" sequence including a first ninety degree excitation pulse (90x) followed after a time period of 2τ+$τ_p$ by a second ninety degree excitation pulse (90-y), followed after a time period τ by an 180 degree pulse (180x) of length $τ_p$, followed after a time period 2τ by three 180 degree pulses (180x, 180-x, 180-x) each spaced by a time period 2τ, and followed by another ninety degree excitation pulse (90-y). An echo is recorded after this ninety degree pulse.

Figure 3G:
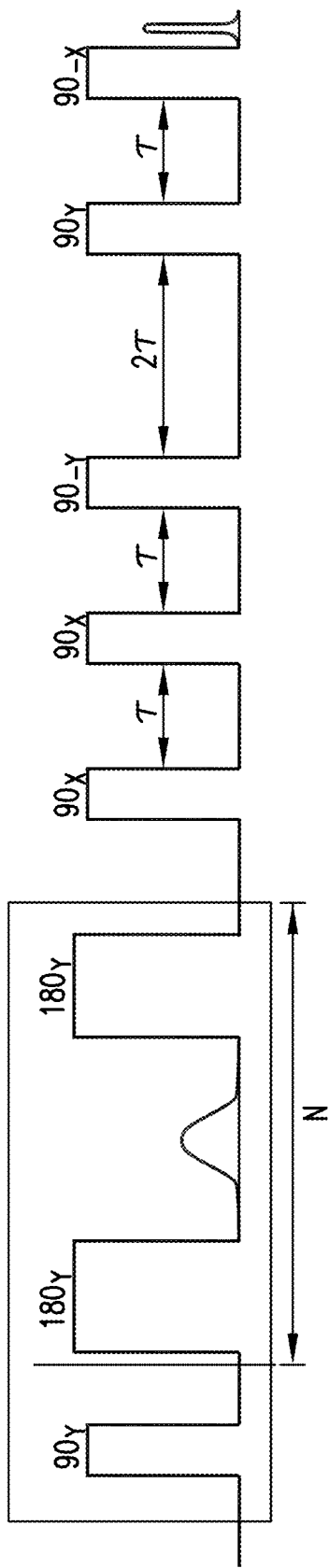

FIG. 3g shows a pulse sequence that is similar to the pulse sequence of FIG. 3c except that the CPMG sequence portion is utilized first, and the solid state pulse sequence portion follows the CPMG portion. Thus, FIG. 3g shows a CMPG pulse sequence including a ninety degree excitation pulse (90y) followed by a series of NMR of N refocusing pulses (180y), with echo measurements being made between the 180° refocusing pulses. After the CPMG sequence, a solid state pulse sequence portion includes a WAHUHA pulse sequence portion that involves a first ninety degree excitation pulse (90x) followed after a period of time τ by a second ninety degree excitation pulse (90x), followed after a period of time τ by a third ninety degree excitation pulse (90-y), followed after a period of time 2τ by a fourth ninety degree excitation pulse (90-y), followed after a period of time τ by a fifth ninety degree excitation pulse (90-y). An echo is recorded after this fifth ninety degree pulse.

Figure 3H:
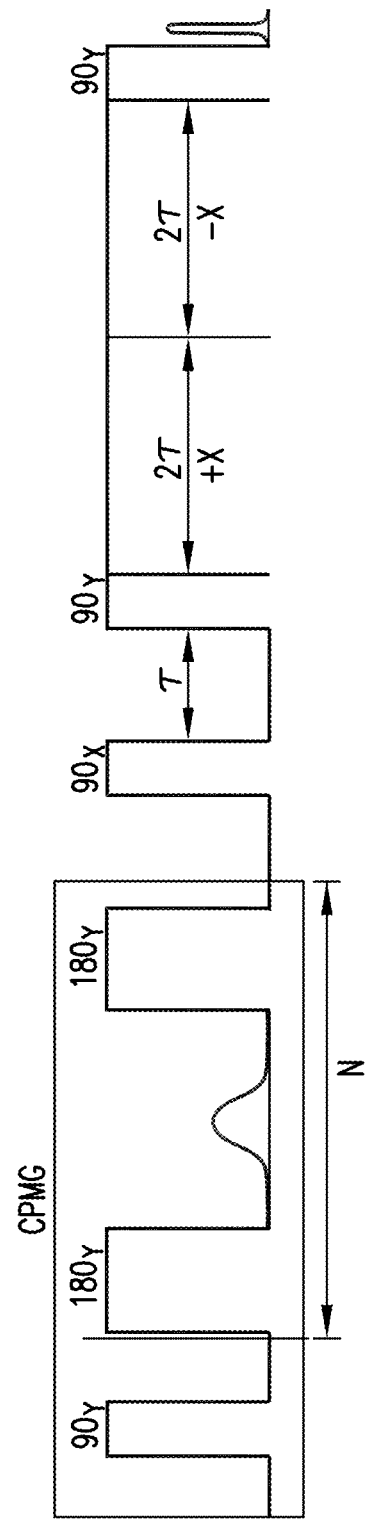

FIG. 3h shows a pulse sequence that is similar to the pulse sequence of FIG. 3d except that the CPMG sequence portion is utilized first, and the solid state pulse sequence portion follows the CPMG portion. Thus, FIG. 3h shows a CMPG pulse sequence including a ninety degree excitation pulse (90y) followed by a series of NMR of N refocusing pulses (180y), with echo measurements being made between the 180° refocusing pulses. After the CPMG sequence, a solid state pulse sequence portion includes a Magic echo pulse sequence portion having a first ninety degree excitation pulse (90x) followed after a period of time τ by a second ninety degree excitation pulse (90y), which is followed after a period of 4 τ (during which time spin-locking +x and −x pulses are provided) by another ninety degree excitation pulse (90y). An echo is recorded after this ninety degree pulse.

As previously indicated, an echo is recorded after the solid state pulse sequence portion of each of the pulse sequences of FIGS. 3a-3h, and additional echoes are recorded between the 180° refocusing pulses of the CPMG sequence portion. As will be described in more detail hereinafter, the amplitude of the solid state pulse echo is indicative of the total hydrogen content of the sample, which may include hydrogen contained in both solids and fluids of the sample being investigated, whereas the echo train of the CPMG sequence is indicative of the hydrogen contained in the fluid portion of the sample. As a result, the difference between amplitudes is indicative of the hydrogen contained in the solid portion of the sample being investigated.

Figure 4A:
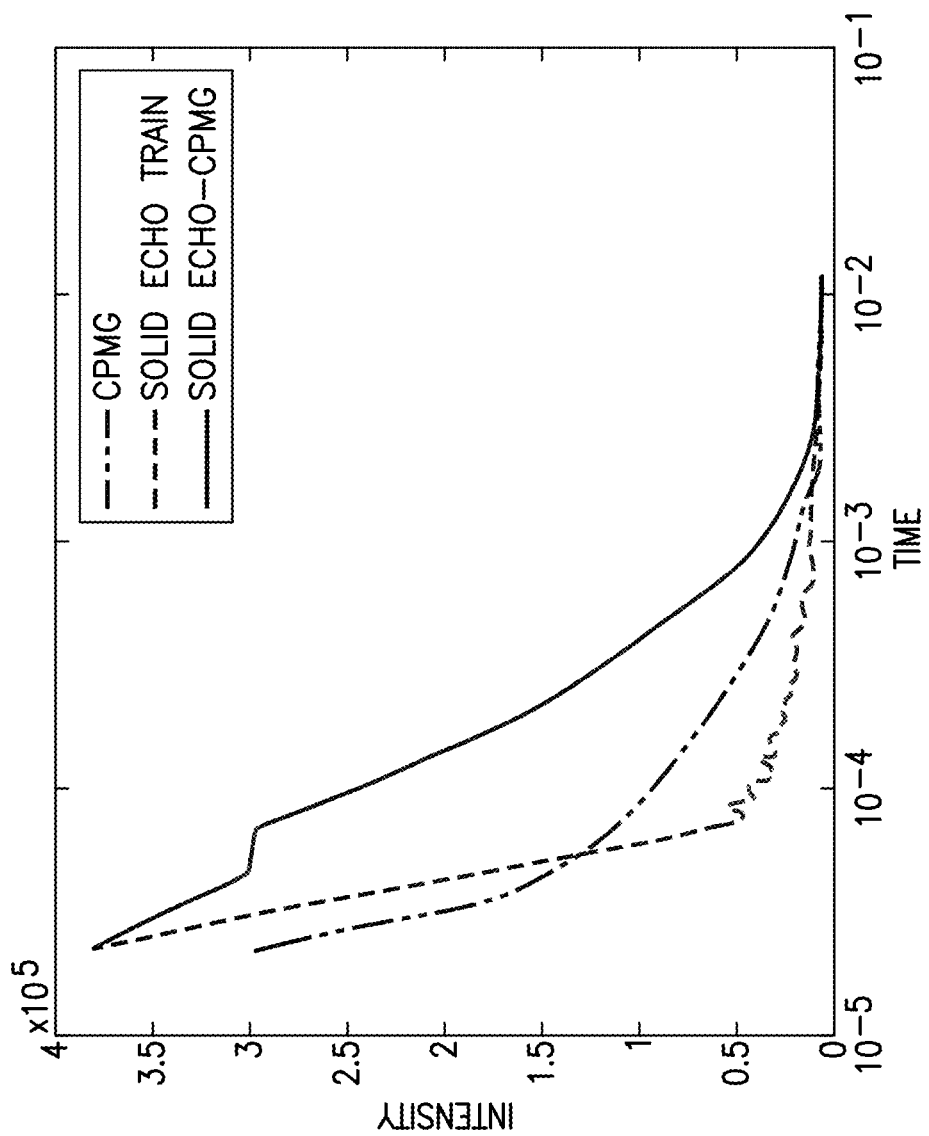
FIGS. 4a and 4b are plots respectively comparing results and processed inversion results from the pulse sequence of FIG. 3a, a processed CPMG sequence, and a processed solid state pulse sequence.

Turning now to FIG. 4a, the amplitude (intensity) of the recorded echoes resulting from an investigation of a sample containing solid hydrocarbons and fluid hydrocarbons utilizing the pulse sequence of FIG. 3a (or FIG. 3e) is seen. The echo information is compared against recorded echoes resulting from an investigation of the same sample using a simple CPMG sequence and using a solid echo train sequence (which involves repeated ninety degree pulses only). As is seen in FIG. 4a, the first echo of the pulse sequence of FIG. 3a has an amplitude equal to the echo of the solid echo train sequence and larger than the CPMG sequence. The remaining echo train of the pulse sequence of FIG. 4a is similar to the pulse train of the CPMG sequence.

Figure 4B:
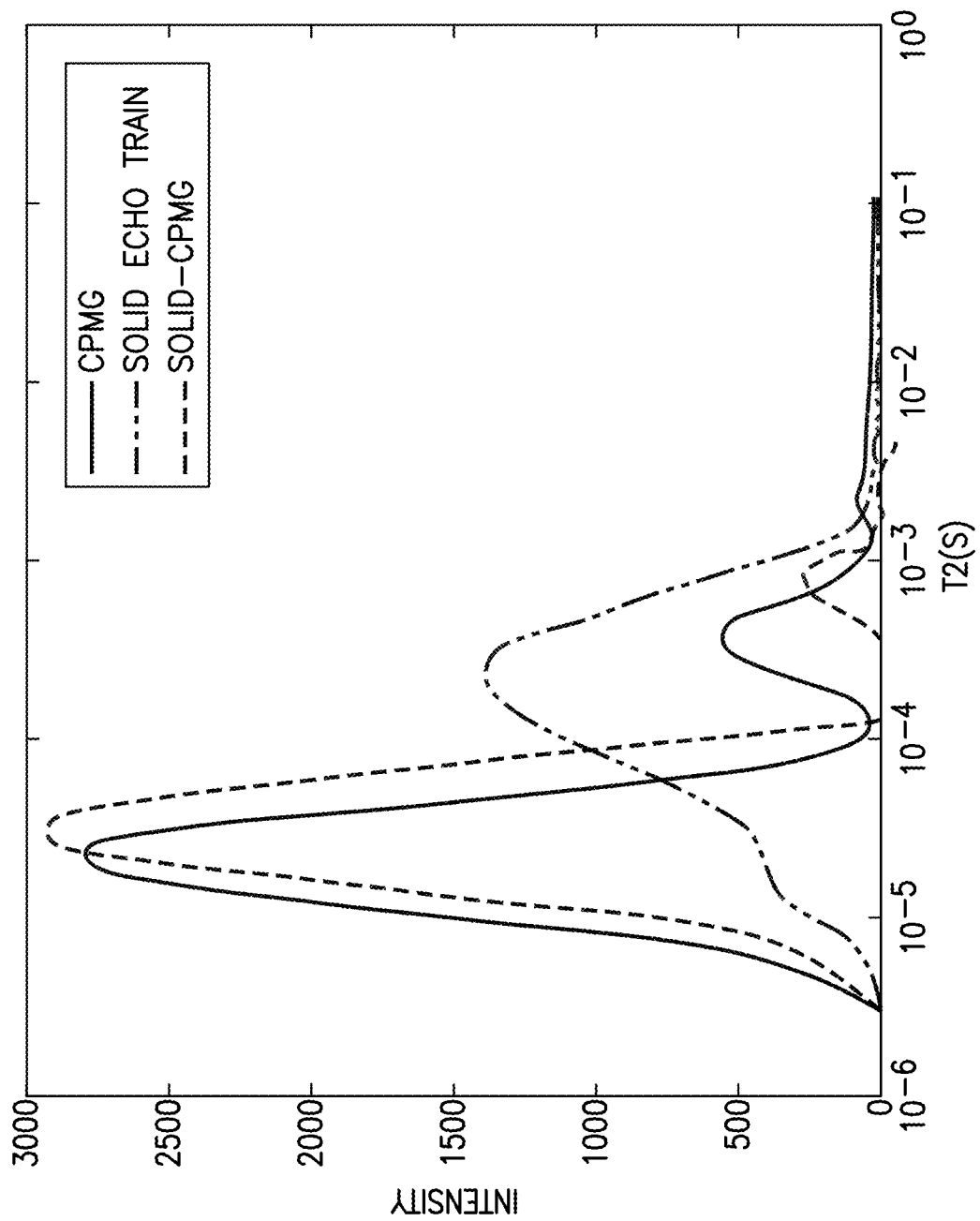

Results obtained after inverting the echo data information of FIG. 4a using a fast inverse Laplace transformation are seen in FIG. 4b. More particularly, FIG. 4b provides $T_2$ distribution maps that result from the processing of data resulting from each of the pulse sequences. The areas under the respective curves correlate directly to the intensities of the first echoes in FIG. 4a which in turn relates to the total hydrogen content of the sample. In addition, the $T_2$ distributions for the CPMG and FIG. 3a pulse sequences provide information regarding the hydrogen content of the fluid portion of the sample.

FIGS. 5a-5h, present additional embodiments of pulse sequences that are useful in analyzing fluid-bearing solids. Each of the pulse sequences incorporates a two-dimensional line-narrowing pulse sequence portion that produces echoes that do not suffer from dipolar interaction, and a CPMG sequence portion. Each of the pulse sequences may be implemented by the system and apparatus of FIGS. 1 and 2, or with other equipment.

Figure 5A:
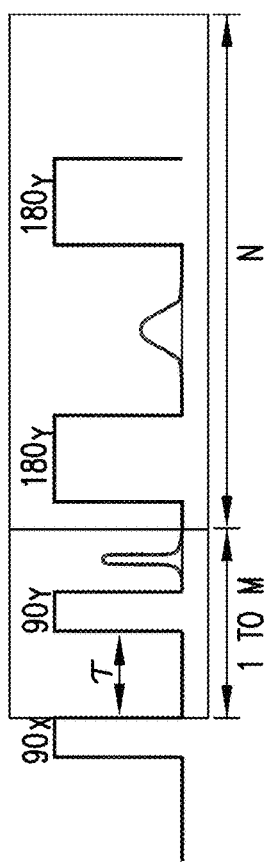

The pulse sequence of FIG. 5a provides a two-dimensional line-narrowing pulse sequence portion, followed by a CPMG pulse sequence portion. The two-dimensional line-narrowing pulse sequence portion is a two-dimensional solid echo pulse sequence that includes a first ninety degree excitation pulse (90x) followed after a wait period τ by a second ninety degree excitation pulse (90y) as in the solid echo line-narrowing pulse sequence of FIG. 3a. However, in the two-dimensional solid echo line-narrowing pulse sequence, additional ninety degree excitation pulses (M pulses) spaced by rare generated. In one embodiment the value of τ may be changed each time. In another embodiment r is kept constant. In any event, pulse echoes may be recorded after the second ninety degree excitation pulse and after every other ninety degree excitation pulse and may be plotted (as described with respect to the solid echo train of FIG. 4a). The last of the M ninety degree excitation pulses may be considered the beginning of the CPMG pulse sequence portion, and the pulse echo train resulting from the CPMG pulse sequence portion is recorded. It will be appreciated by those of skill in the art that the echoes resulting from and recorded with respect to the two-dimensional solid echo line-narrowing pulse sequence portion provides information regarding the total hydrogen content of the sample, which may include hydrogen contained in both solids and fluids of the sample being investigated, whereas the echo train of the CPMG sequence is indicative of the hydrogen contained in the fluid portion of the sample. As a result, the difference between amplitudes is indicative of the hydrogen contained in the solid portion of the sample being investigated. In addition the echo train of the CPMG sequence can be processed to provide $T_2$ distribution information.

Figure 5B:
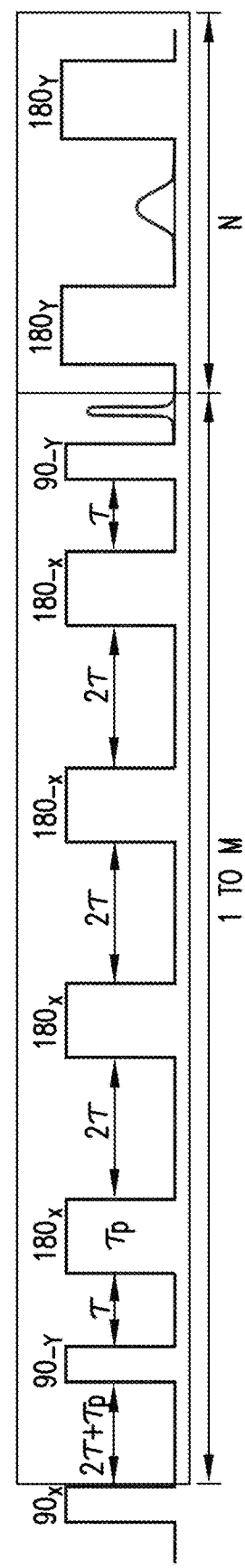

Turning to FIG. 5b, another pulse sequence is provided. The pulse sequence of FIG. 5b can be described as a two-dimensional quadratic echo pulse sequence which is followed by a CPMG pulse sequence. The two-dimensional quadratic echo pulse sequence involves a first ninety degree excitation pulse (90x) followed by a (sub)-sequence that is repeated M times. In particular, the first ninety degree pulse is followed after a time period of 2τ+$τ_p$ by a second ninety degree excitation pulse (90-y), followed after a time period τ by an 180 degree pulse (180x) of length $τ_p$, followed after a time period 2τ by three 180 degree pulses (180x, 180-x, 180-x) each spaced by a time period 2τ, and followed by another ninety degree excitation pulse (90-y). This (sub)-sequence is repeated M times (with constant or varying τ) and a series of "first" echoes are recorded after this ninety degree pulse. The last ninety degree excitation pulse (90-y) of the M repetitions may be considered the beginning of the CPMG pulse sequence which continues as previously described with respect to FIG. 3a with additional echoes (the CPMG "echo train") being recorded. As with the pulse sequence of FIG. 5a, the recorded and processed echo trains resulting from the pulse sequence of FIG. 5b may be used to find the total hydrogen content of the sample, the hydrogen contained in the fluid portion of the sample, the hydrogen contained in the solid portion of the sample, and $T_2$ distribution information.

Figure 5C:
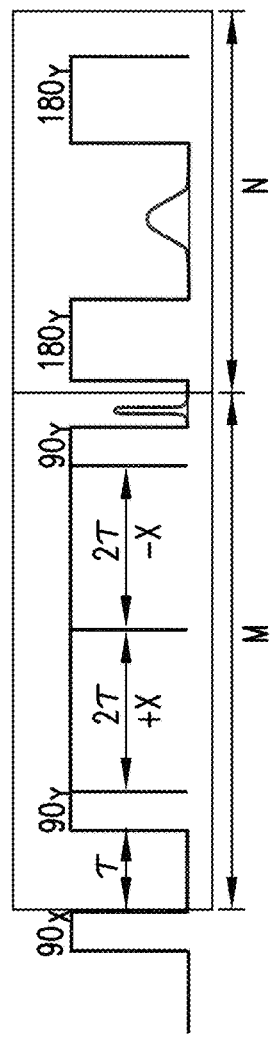

FIG. 5c shows another pulse sequence which may be described as a two-dimensional WAHUHA line-narrowing pulse sequence which is followed by a CPMG pulse sequence. The two-dimensional WAHUHA pulse sequence involves a first ninety degree excitation pulse (90x) followed by a (sub)-sequence that is repeated M times. In particular, the first ninety degree excitation pulse is followed after a period of time τ by a second ninety degree excitation pulse (90x), followed after a period of time τ by a third ninety degree excitation pulse (90-y), followed after a period of time 2τ by a fourth ninety degree excitation pulse (90-y), followed after a period of time τ by a fifth ninety degree excitation pulse (90-y). This (sub)-sequence is repeated M times (with constant or varying τ), and a series of "first" echoes are recorded after this ninety degree pulse. The last ninety degree excitation pulse (90-y) of the M repetitions may be considered the beginning of the CPMG pulse sequence which continues as previously described with respect to FIG. 3a with additional echoes (the CPMG "echo train") being recorded. As with the pulse sequences of FIGS. 5a and 5b, the recorded and processed echo trains resulting from the pulse sequence of FIG. 5c may be used to find the total hydrogen content of the sample, the hydrogen contained in the fluid portion of the sample, the hydrogen contained in the solid portion of the sample, and $T_2$ distribution information.

FIG. 5d shows another pulse sequence embodiment incorporating another two-dimensional line-narrowing pulse sequence portion which may be described as a two-dimensional Magic echo pulse sequence which is followed by a CPMG pulse sequence portion. The two-dimensional Magic echo pulse sequence portion involves a first ninety degree excitation pulse (90x) followed by a (sub)-sequence that is repeated M times. In particular, the first ninety degree excitation pulse is followed after a period of time τ by a second ninety degree excitation pulse (90y), which is followed after a period of 4τ (during which time spin-locking +x and −x pulses are provided) by another ninety degree excitation pulse (90y). This (sub)-sequence is repeated M times (with constant or varying τ), and a series of "first" echoes are recorded after this ninety degree pulse. The last ninety degree excitation pulse (90y) of the M repetitions may be considered the beginning of the CPMG pulse sequence portion which continues as previously described with respect to FIG. 3a with additional echoes (the CPMG "echo train") being recorded. As with the pulse sequences of FIGS. 5a, 5b and 5c, the recorded and processed echo trains resulting from the pulse sequence of FIG. 5d may be used to find the total hydrogen content of the sample, the hydrogen contained in the fluid portion of the sample, the hydrogen contained in the solid portion of the sample, and $T_2$ distribution information.

FIG. 5e is similar to FIG. 5a except that the pulse sequence begins with a CPMG portion followed by a two-dimensional solid echo pulse portion. The CPMG portion includes a ninety degree excitation pulse (90y) followed by a series of NMR of N refocusing pulses (180y), with echo measurements being made between the 180° refocusing pulses. After the CPMG sequence, the two-dimensional line-narrowing pulse sequence is conducted. The two-dimensional line-narrowing pulse sequence portion is a two-dimensional solid echo pulse sequence that includes a first ninety degree excitation pulse (90x) followed after a wait period τ by a second ninety degree excitation pulse (90y) followed by additional ninety degree excitation pulses (M pulses) spaced by τ. In one embodiment the value of τ may be changed each time. In another embodiment τ is kept constant. In any event, pulse echoes may be recorded after the second ninety degree excitation pulse and after every other ninety degree excitation pulse and may be plotted (as described with respect to the solid echo train of FIG. 4a).

FIG. 5f is similar to FIG. 5b except that the pulse sequence begins with a CPMG portion followed by a two-dimensional quadratic echo pulse sequence. The CPMG portion includes a ninety degree excitation pulse (90y) followed by a series of NMR of N refocusing pulses (180y), with echo measurements being made between the 180° refocusing pulses. After the CPMG sequence, the two-dimensional quadratic echo line-narrowing pulse sequence portion is conducted and involves a first ninety degree excitation pulse (90x) followed by a (sub)-sequence that is repeated M times. In particular, the first ninety degree pulse is followed after a time period of 2τ+$τ_p$ by a second ninety degree excitation pulse (90-y), followed after a time period τ by an 180 degree pulse (180x) of length $τ_p$, followed after a time period 2τ by three 180 degree pulses (180x, 180-x, 180-x) each spaced by a time period 2τ, and followed by another ninety degree excitation pulse (90-y). This (sub)-sequence is repeated M times (with constant or varying τ) and a series of "first" echoes are recorded after this ninety degree pulse.

Figure 5G:
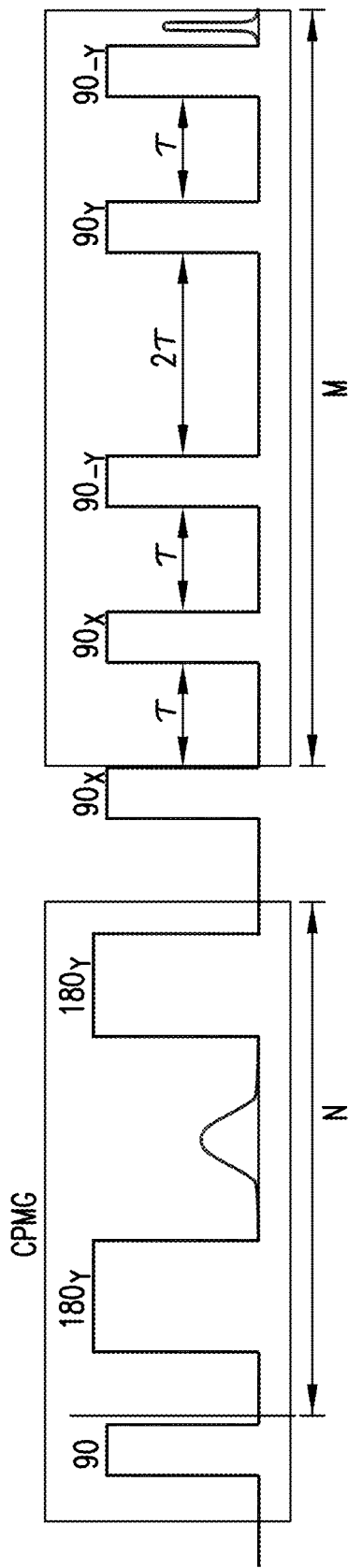

FIG. 5g is similar to FIG. 5c except that the pulse sequence begins with a CPMG portion followed by a two-dimensional WAHUHA line-narrowing pulse sequence. The CPMG portion includes a ninety degree excitation pulse (90y) followed by a series of NMR of N refocusing pulses (180y), with echo measurements being made between the 180° refocusing pulses. After the CPMG sequence, the two-dimensional WAHUHA line-narrowing pulse sequence is conducted and involves a first ninety degree excitation pulse (90x) followed by a (sub)-sequence that is repeated M times. In particular, the first ninety degree excitation pulse is followed after a period of time τ by a second ninety degree excitation pulse (90x), followed after a period of time τ by a third ninety degree excitation pulse (90-y), followed after a period of time 2τ by a fourth ninety degree excitation pulse (90-y), followed after a period of time τ by a fifth ninety degree excitation pulse (90-y). This (sub)-sequence is repeated M times (with constant or varying τ), and a series of "first" echoes are recorded after this ninety degree pulse.

Figure 5H:
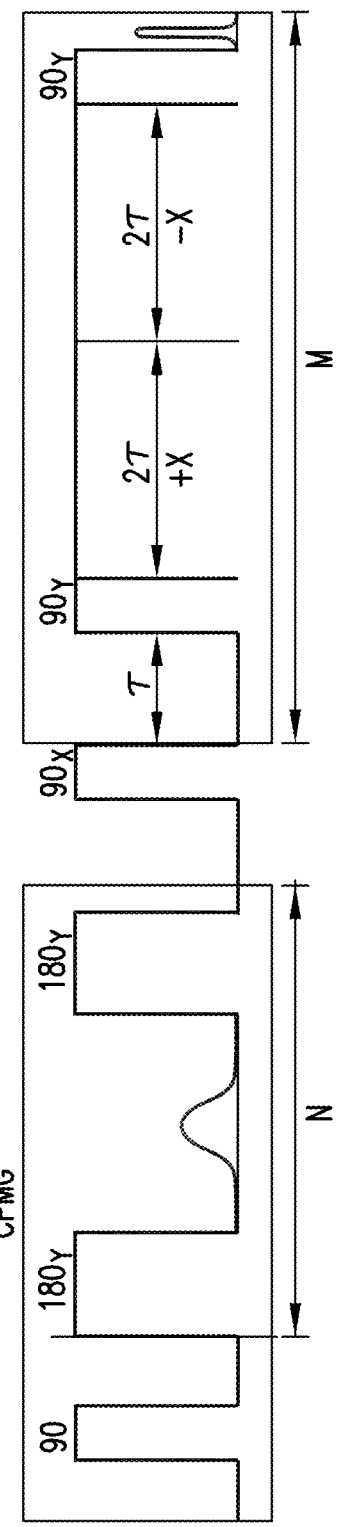

FIG. 5h is similar to FIG. 5d except that the pulse sequence begins with a CPMG portion followed by a two-dimensional Magic echo pulse sequence. The CPMG portion includes a ninety degree excitation pulse (90y) followed by a series of NMR of N refocusing pulses (180y), with echo measurements being made between the 180° refocusing pulses. After the CPMG sequence, the two-dimensional Magic echo pulse sequence is conducted and involves a first ninety degree excitation pulse (90x) followed by a (sub)-sequence that is repeated M times. In particular, the first ninety degree excitation pulse is followed after a period of time τ by a second ninety degree excitation pulse (90y), which is followed after a period of 4τ (during which time spin-locking +x and −x pulses are provided) by another ninety degree excitation pulse (90y). This (sub)-sequence is repeated M times (with constant or varying τ), and a series of "first" echoes are recorded after this ninety degree pulse.

As with the pulse sequences of FIGS. 5a-5d, the recorded and processed echo trains resulting from the pulse sequences of FIGS. 5e-5h may be used to find the total hydrogen content of the sample, the hydrogen contained in the fluid portion of the sample, the hydrogen contained in the solid portion of the sample, and $T_2$ distribution information.

Figure 6B:
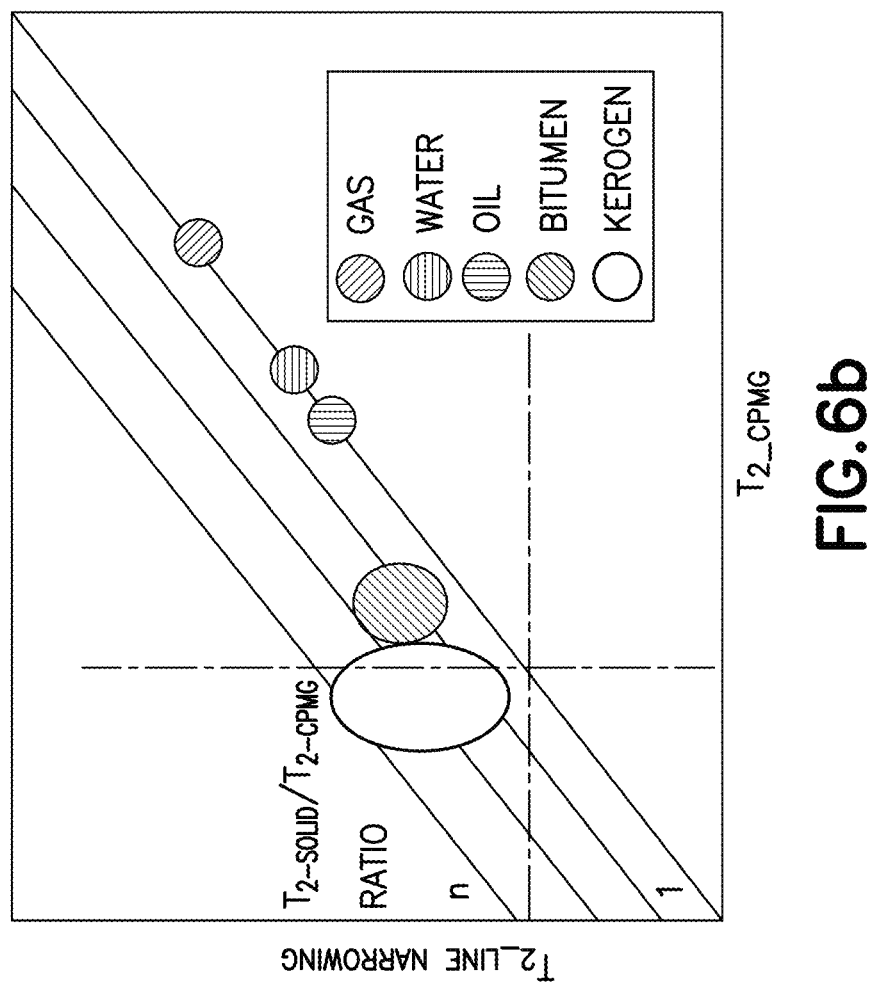

Turning now to FIG. 6a, a hypothetical plot of the amplitude (intensity) of the recorded echoes resulting from an investigation by a borehole tool of a sample containing solid hydrocarbons and fluid hydrocarbons utilizing the pulse sequence of FIG. 5a is seen. Hypothetical results obtained after inverting the echo data information of FIG. 5a using a fast inverse Laplace-Laplace transformation are seen in FIG. 6b. More particularly, FIG. 6b shows a distribution map that results from the processing of data resulting from the pulse sequence incorporating the two-dimensional line-narrowing pulse sequence portion, followed by a CPMG pulse sequence portion, where $T_{2\text{-}linearrowed}$ values obtained from processing the echo data from the 2D line-narrowing sequence are plotted against the $T_2$ values obtained from processing the CPMG. As seen in FIG. 6b, the ratio and the absolute values of the determined relaxation times may be used to identify a characteristic of the sample, and in particular, different species (such as kerogen from bitumen and other lighter fluids) in the sample may be identified as the $T_{2\text{-}linenarrowed}/T_2$ ratios are different for the different species.

Figure 7:
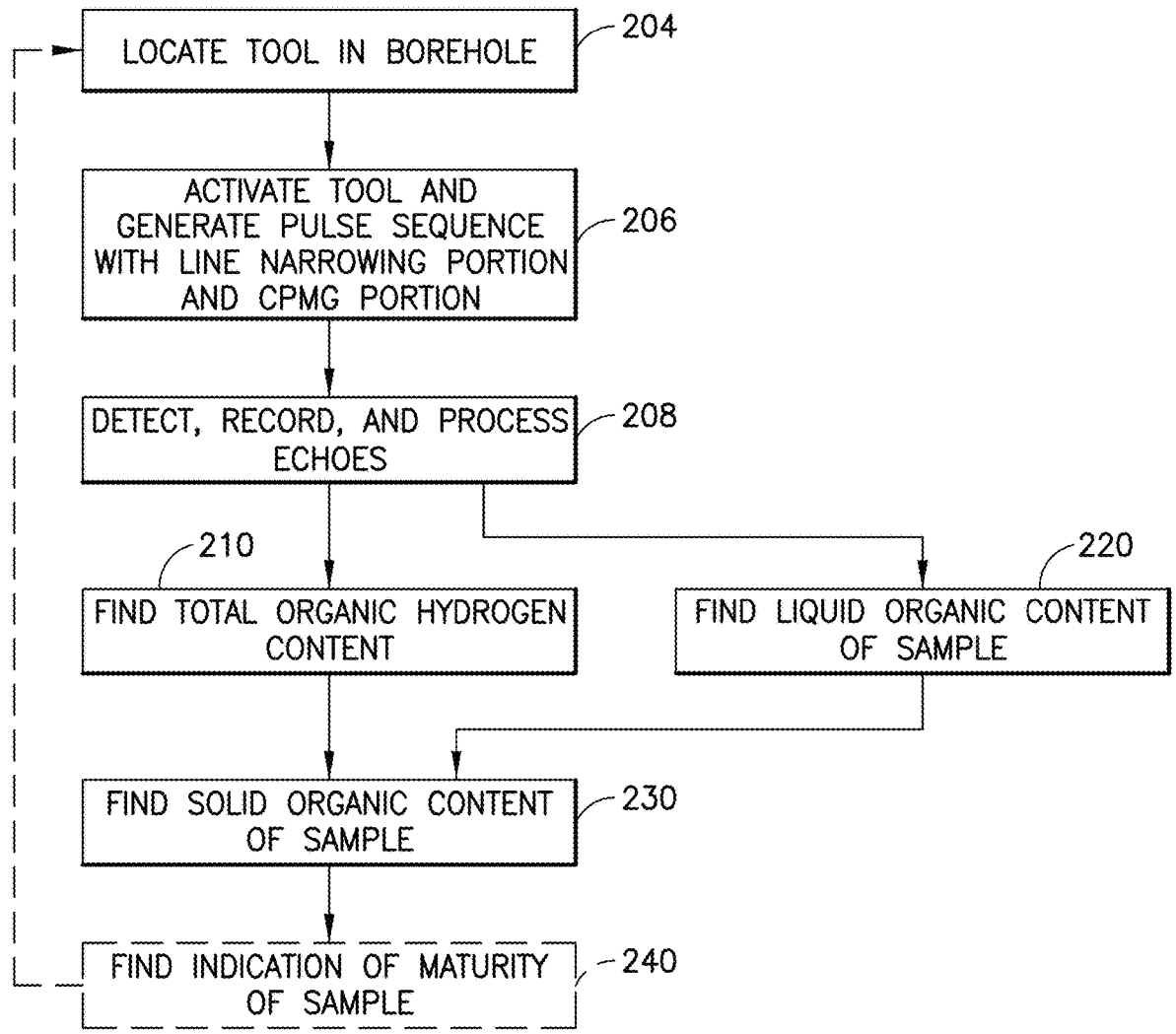
FIG. 7 is a flow diagram of a method utilizing the processed results of NMR pulse sequences incorporating a solid state pulse sequence in conjunction with a CPMG sequence.

In one embodiment, a method as shown in FIG. 7 includes locating an NMR tool in a borehole at 204 and activating the tool at 206 to generate a pulse sequence according to any of the pulse sequences of FIGS. 3a-3h. At 208, echoes resulting from the pulse sequence are detected, recorded and processed. At 210, the intensity of the echo resulting from the pulse narrowing sequence portion of the pulse sequence is used to establish a characteristic of the sample, and in particular the total organic hydrogen content of the sample. At 220, the echo train resulting from the CPMG portion of the pulse sequence is used to find a characteristic of the sample, and in particular the intensity of the fluid organic hydrogen content of the sample. This may be done by finding the $T_2$ decay from the echo train and calculating the intensity at time t=0. At 230, the difference between the intensity of the echo resulting from the pulse narrowing sequence portion and from the CPMG portion is found and attributed to a characteristic of the sample, and in particular the solid organic hydrogen content of the sample, e.g., the kerogen. At 240, the solid organic hydrogen content of the sample is optionally used to find an indication of the maturity of the formation represented by the sample (as discussed hereinafter with reference to FIG. 8) which may be useful in making decisions regarding production of the formation.

In one embodiment, steps 204-230 or 204-240 may be repeated at a plurality of depths of the formation and the solid organic hydrogen content and/or the maturity indications at the various depths may be compared with each other. Again, this information may be useful in making decisions regarding production of the formation.

Figure 8:
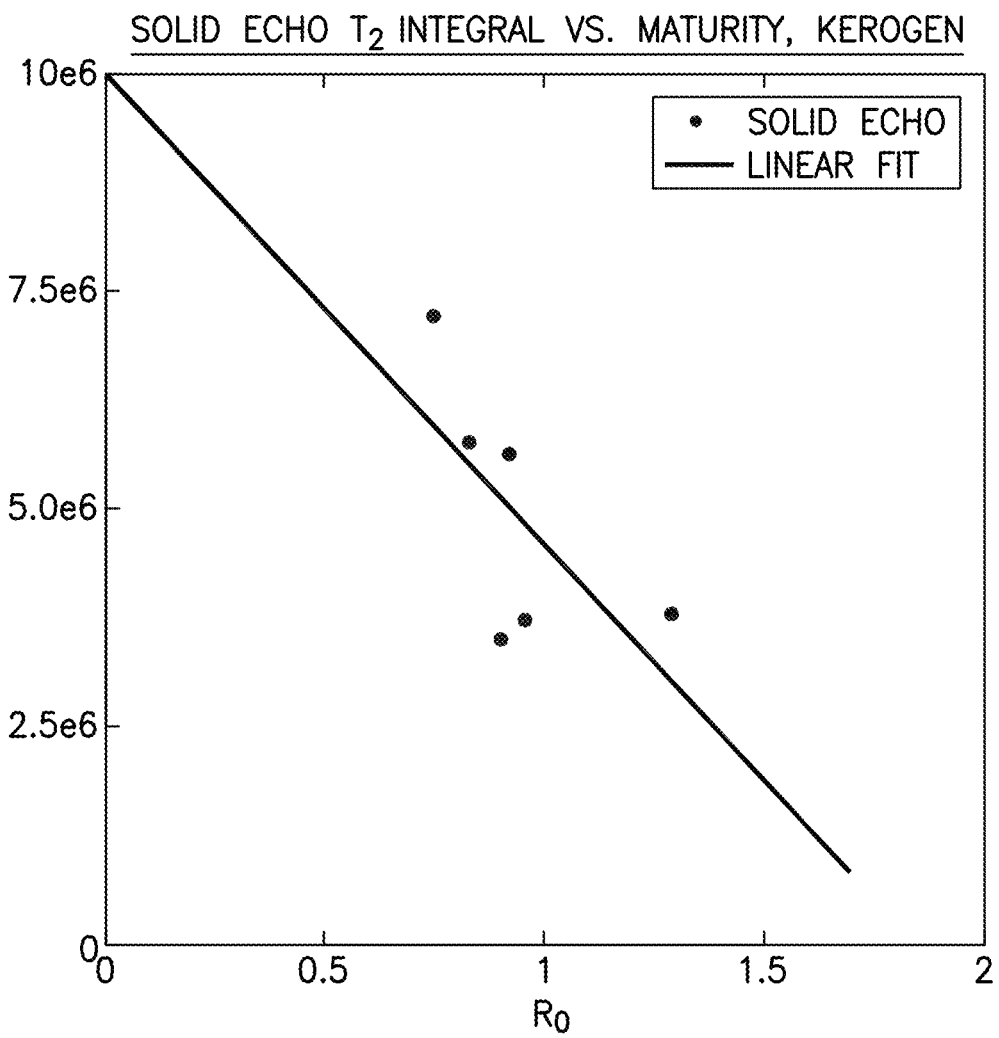
FIG. 8 is plot of the intensity of results of a solid echo solid state pulse sequence performed on samples of kerogen versus formation maturity.

FIG. 8 is a plot of an integral of the $T_2$ signal obtained via a solid echo pulse sequence versus the maturity of the sample for various samples of different maturities. More particularly, it may be seen from FIG. 8 that the total organic hydrogen measured using the line narrowing pulse sequence correlates with the maturity measured using vitrinite reflectance. The process of maturation results in the decrease of the total organic hydrogen in the kerogen due to its conversion into hydrocarbons such as oil and gas that escape out. Therefore, the total organic hydrogen content of the kerogen samples are expected to reduce as a function of maturity.

Figure 9:
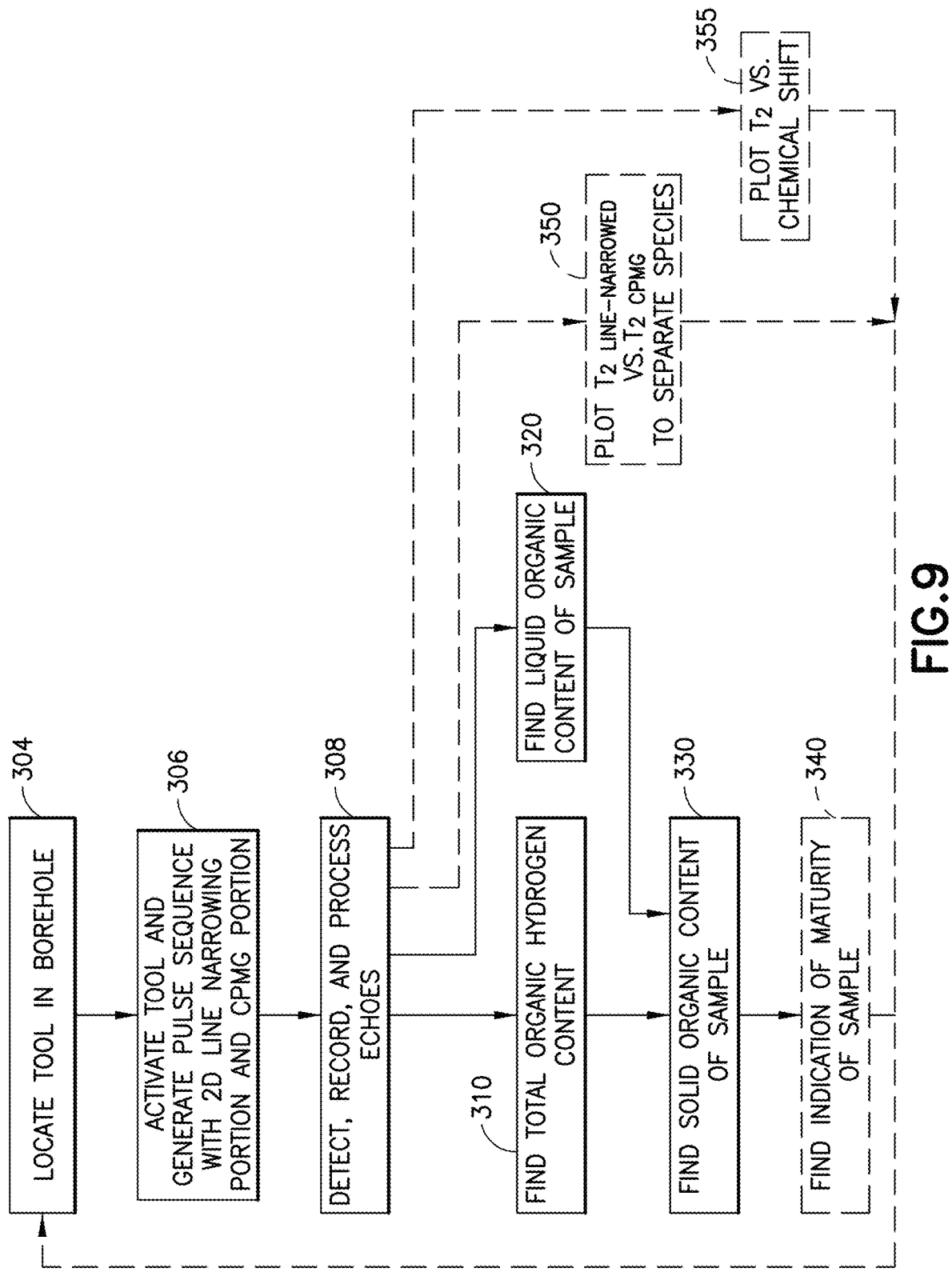
FIG. 9 is a flow diagram of a method utilizing the processed results of NMR pulse sequences incorporating a two-dimensional line-narrowing sequence in conjunction with a CPMG sequence.

Turning now to FIG. 9, according to another embodiment, an NMR tool is located in a borehole at 304 and activated at 306 to generate a pulse sequence according to any of the pulse sequences of FIGS. 5a-5h. At 308, echoes resulting from the pulse sequence are detected, recorded and processed. In one embodiment, the processing involves a fast inverse Laplace-Laplace transformation. At 310, the intensity of the first echo resulting from the two-dimensional line narrowing sequence portion of the pulse sequence is used to establish a characteristic of the sample, and in particular the total organic hydrogen content of the sample. At 320, the echo train resulting from the CPMG portion of the pulse sequence is used to find a characteristic of the sample, and in particular the intensity of the fluid organic hydrogen content of the sample. This may be done by finding the $T_2$ decay from the echo train and calculating the intensity at time t=0. At 330, the difference between the results of the pulse-narrowing sequence portion and from the CPMG portion is found and attributed to a characteristic of the sample, and in particular the solid organic hydrogen content of the sample, e.g., the kerogen. At 340, the solid organic hydrogen content of the sample is optionally used to find an indication of the maturity of the formation represented by the sample which may be useful in making decisions regarding production of the formation.

In one embodiment, at 350, a plurality of echoes resulting from the two-dimensional pulse narrowing sequence are used to generate a $T_2$ plot such as that shown in FIG. 4a which may be inverted and used in conjunction with the $T_2$ plot obtained from the CPMG echoes to obtain a ratio $T_{2\text{-}linenarrowed}/T_2$ as seen in FIG. 6b. As seen in FIG. 6b, the ratio and the absolute values of the relaxation times may be used to identify a characteristic of the sample, and in particular different species (such as kerogen from bitumen and other lighter fluids) in the sample as the $T_{2\text{-}linenarrowed}/T_2$ ratios are different for the different species. This information is also optionally used to find an indication of the maturity of the formation represented by the sample which may be useful in making decisions regarding production of the formation.

In another embodiment, at 308, instead of utilizing a fast inverted Laplace-Laplace transformation, the detected echo data is processed using Laplace and Fourier inversions to obtain $T_2$-chemical shift map which can differentiate different components of sample and which may be plotted at 355.

In one embodiment, steps 304-330, or 304-340, or 304-308 and 350, or 304-308 and 350, (or any combination thereof) may be repeated at a plurality of depths of the formation. The obtained information from the various depths may be compared with each other. Again, this information may be useful in making decisions regarding production of the formation.

Figure 10:
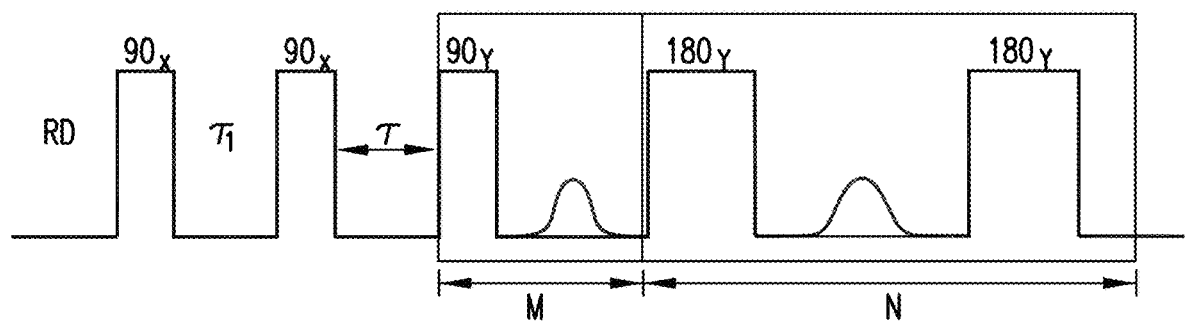
FIG. 10 is a diagram of a 3D NMR pulse sequence that incorporates a T1 portion, a line-narrowing portion, and a CPMG portion.

Turning to FIG. 10, another pulse sequence embodiment is seen and comprises a 3D pulse sequence which includes a $T_1$ pulse sequence portion (ninety degree pulses separated by time $\tau_1$) a two-dimensional (solid echo type) line-narrowing pulse sequence portion comprised of a series (M) of ninety degree pulses and generating echoes, and a CPMG pulse sequence portion generating another train of echoes. It will be appreciated that in the 3D pulse sequence shown in FIG. 10, the 2D solid echo line-narrowing pulse sequence portion of the sequence utilizes the last pulse of the preceding $\tau_1$ pulse sequence portion as its first pulse, and the CPMG pulse sequence portion utilizes the last pulse of the preceding solid echo line-narrowing pulse sequence portion as its first pulse. In order to obtain $T_1$ sensitivity, it will be appreciated that the entire sequence of FIG. 10 would be repeated multiple times with $\tau_1$ times being varied.

While FIG. 10 shows a $T_1$ pulse sequence followed by a 2D solid echo line-narrowing sequence which in turn is followed by a CPMG pulse sequence, according to another aspect, the $T_1$ sequence can be added to any of the pulse sequences of FIGS. 5a-5h in order to obtain a 3D sequence. Fast inversion Laplace-Laplace processing will give a $T_1$-$T_{2CPMG}$-$T_{2line\text{-}narrowing}$ 3D map which will differentiate different components of sample. Processing utilizing Fourier-Laplace inversions may also be utilized to obtain a $T_1$-$T_2$-chemical shift map which will differentiate different components of the sample. Thus, according to one aspect, the method shown in FIG. 9 may be further modified to conduct a 3D pulse sequence at 306 utilizing a $T_1$ pulse sequence portion, a 2D line-narrowing sequence portion, and a CPMG pulse sequence portion, and the processing may be modified at 308 to conduct a fast Laplace-Laplace inversion or a Fourier-Laplace inversion to obtain a $T_1$-$T_{2line\text{-}narrowing}$-$T_2$ map or a $T_1$-$T_2$-chemical shift map.

Figure 11:
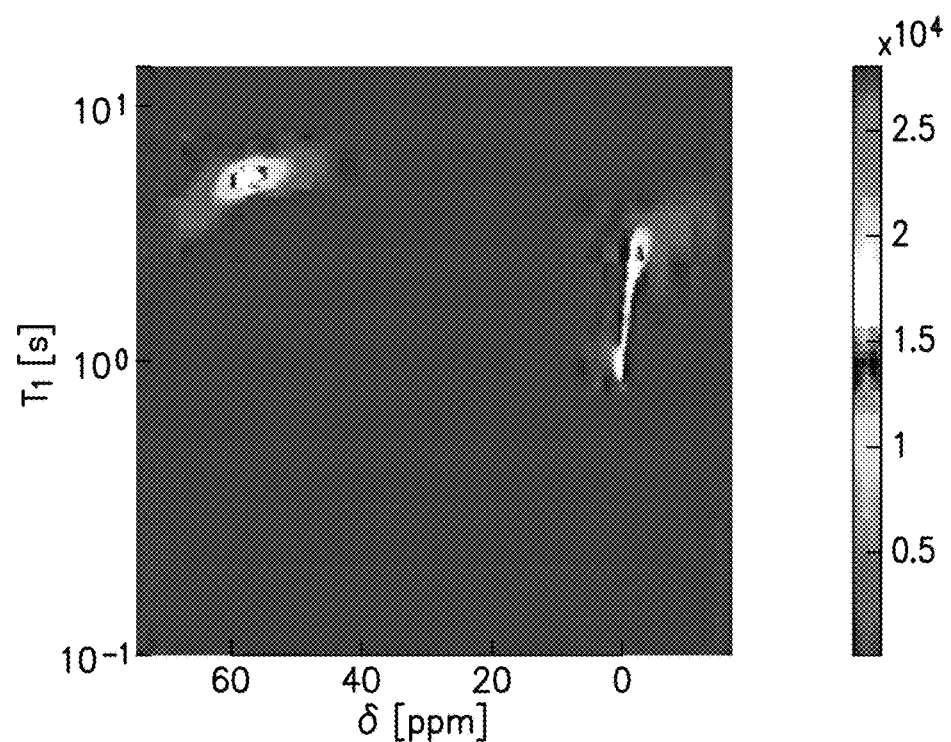
FIG. 11 is a $T_1$-chemical shift plot.

It will be appreciated that sections through or parallel to any of axes of the 3D maps may generate useful 2D maps. Thus, by way of example only, a section parallel the $T_2$ axis of a $T_1$-$T_2$-chemical shift map can be used to generate a $T_1$-chemical shift map (the chemical shift obtained utilizing the line-narrowing sequence) as seen in FIG. 11 where the fluorine spectra of two components (namely HFB and single crystal $CaF_2$) are well separated in the chemical shift dimension, and their different relaxation times can be measured. In particular, at a chemical shift of about 58 ppm and a $T_1$ of about 7 seconds, a signal is seen and reaches an amplitude of maximum intensity of about $2\times10^4$. A second well-separated signal which reaches an amplitude of maximum intensity of about $2.5\times10^4$ is seen at a chemical shift of 0 ppm (no chemical shift) and a $T_1$ of starting at 1 second and extending to 6 seconds.

Figure 12:
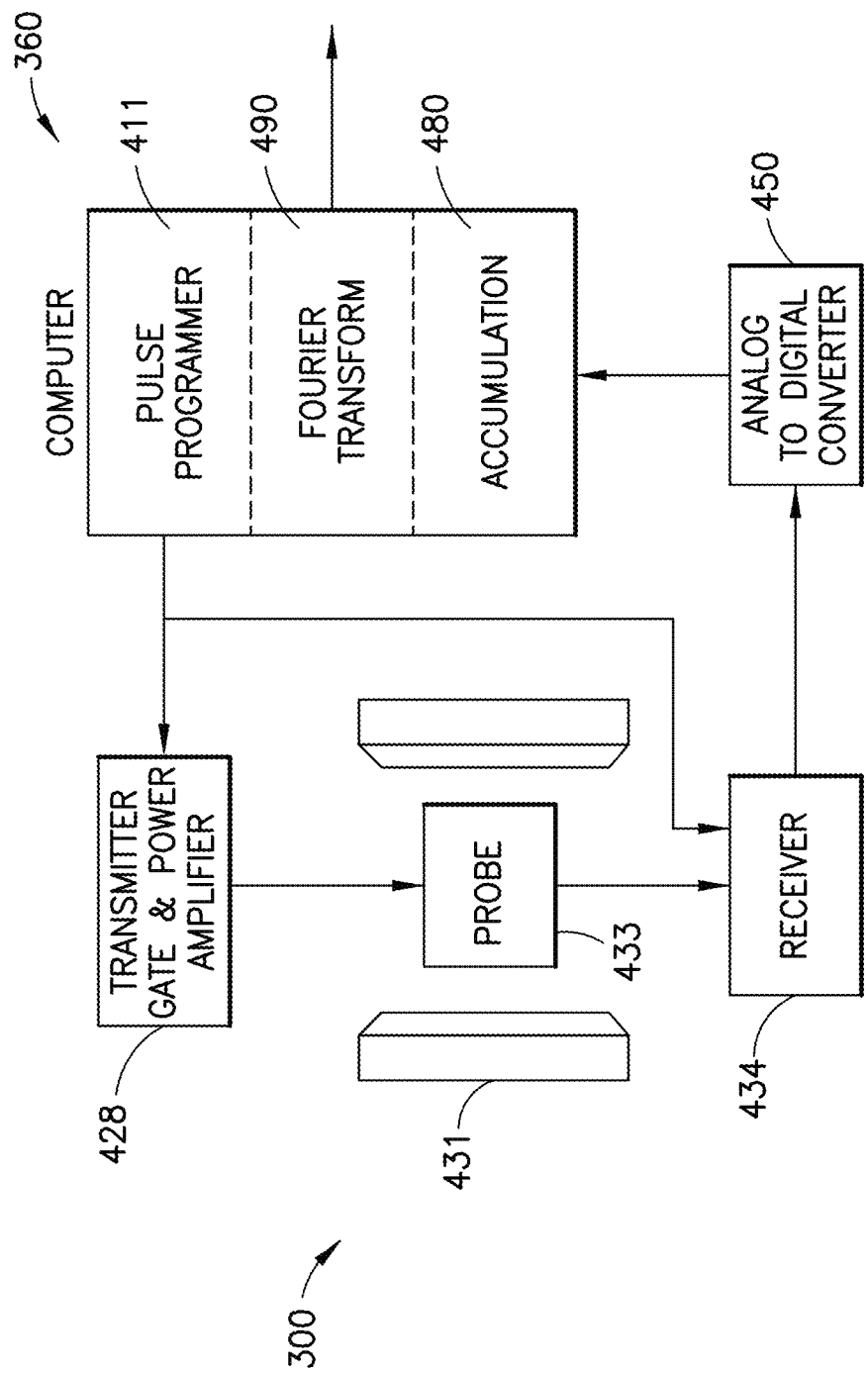
FIG. 12 is a block diagram of an uphole apparatus utilizing the NMR pulse sequences according to any of FIGS. 3a-3h, FIGS. 5a-5h, and 10.

According to another aspect, the previously described pulse sequences may be used uphole (e.g., in a laboratory) in characterizing a sample such as by way of example only, a sample of shale rock. More particularly, turning to FIG. 12, an NMR apparatus 300 includes a computer or processor 360, a pulse programmer 411 implemented in the computer or processor 360 and programmed to generate the pulse sequences described in conjunction with any of FIGS.

3a-3h, FIGS. 5a-5h and FIG. 10, a transmitter 428, magnets 431, a probe 433 having a coil (not shown) in which a sample (not shown) may be located, a receiver 434, an analog to digital converter 450, and an accumulator 480 and Fourier transformer 490 which may also be implemented independently or by the computer or processor 360. Typically, the sample (not shown) may be rotated within a magnetic field generated by the magnets 431 and probe 433. This is in distinction to the downhole tool 50 of FIG. 1 where the sample is a stationary formation in which the tool is located. The pulse sequences described in conjunction with FIGS. 3a-3h, FIGS. 5a-5h and FIG. 10 and programmed in the pulse programmer 411 are generated using the transmitter, gate and power amplifier 428 with the probe 433, so that resultant echo signals are obtained by the receiver 434 and processed by the analog to digital converter 450, accumulator 480, and Fourier transformer 490.

In one aspect, some of the methods and processes described above, such as generating desired pulse sequences and processing the measured echoes resulting from the pulse sequences are performed at least in part by a computer or processor. The terms "computer" and "processor" should not be construed to limit the embodiments disclosed herein to any particular device type or system. A processor may include a computer system. The computer system may also include a computer processor (e.g., a microprocessor, microcontroller, digital signal processor, or general purpose computer) for executing any of the methods and processes described above. The computer system may further include a memory such as a semiconductor memory device (e.g., a RAM, ROM, PROM, EEPROM, or Flash-Programmable RAM), a magnetic memory device (e.g., a diskette or fixed disk), an optical memory device (e.g., a CD-ROM), a PC card (e.g., PCMCIA card), or other memory device.

Some of the methods and processes described above, can be implemented as computer program logic for use with the computer processor. The computer program logic may be embodied in various forms, including a source code form or a computer executable form. Source code may include a series of computer program instructions in a variety of programming languages (e.g., an object code, an assembly language, or a high-level language such as C, C++, or JAVA). Such computer instructions can be stored in a non-transitory computer readable medium (e.g., memory) and executed by the computer processor. The computer instructions may be distributed in any form as a removable storage medium with accompanying printed or electronic documentation (e.g., shrink wrapped software), preloaded with a computer system (e.g., on system ROM or fixed disk), or distributed from a server or electronic bulletin board over a communication system (e.g., the Internet or World Wide Web).

Alternatively or additionally, the processor may include discrete electronic components coupled to a printed circuit board, integrated circuitry (e.g., Application Specific Integrated Circuits (ASIC)), and/or programmable logic devices (e.g., a Field Programmable Gate Arrays (FPGA)). Any of the methods and processes described above can be implemented using such logic devices.

Although only a few examples have been described in detail above, those skilled in the art will readily appreciate that many modifications are possible in the examples without materially departing from this subject disclosure. Thus, by way of example only, and not by way of limitation, while various embodiments describe particular line-narrowing pulse sequences, other line-narrowing pulse sequences may be utilized for the line-narrowing pulse sequence portion.

Also, while particular circuitry was described for generating the pulse sequences, it will be appreciated that other circuitry could be utilized. Accordingly, all such modifications are intended to be included within the scope of this disclosure as defined in the following claims. In the claims, means-plus-function clauses are intended to cover the structures described herein as performing the recited function and not only structural equivalents, but also equivalent structures. It is the express intention of the applicant not to invoke 35 U.S.C. § 112, paragraph 6 for any limitations of any of the claims herein, except for those in which the claim expressly uses the words 'means for' together with an associated function.

What is claimed is:

1. A nuclear magnetic resonance (NMR) tool for investigating a sample having a solid portion and a fluid portion, comprising:
   a magnet;
   a transmitter, including a pulse sequencer and a power amplifier, which is configured to generate and transmit an NMR pulse sequence including a solid state pulse sequence portion and a CPMG pulse sequence portion;
   a receiver including at least one antenna arranged to detect signals resulting from interaction of said NMR pulse sequence with the sample, including at least one echo that results from said solid state pulse sequence portion and a train of echoes between pulses of said CPMG pulse sequence portion, wherein said at least one echo that results from said solid state pulse sequence portion is indicative of total hydrogen content of the sample in both the solid portion and the fluid portion of the sample, and wherein said train of echoes is indicative of hydrogen content in the fluid portion of the sample; and
   a processor that processes said at least one echo that results from said solid state pulse sequence portion and said train of echoes to determine hydrogen content in the solid portion of the sample.

2. The NMR tool of claim 1, wherein said solid state pulse sequence portion includes a first ninety degree excitation pulse followed after a wait period τ by a second ninety degree excitation pulse.

3. The NMR tool of claim 2, wherein said CPMG pulse sequence portion follows said solid state pulse sequence portion, and said second ninety degree excitation pulse constitutes a beginning of said CPMG pulse sequence portion.

4. The NMR tool of claim 2, wherein said solid state pulse sequence portion is a two-dimensional line-narrowing sequence portion that further includes at least one additional ninety degree excitation pulse separated by another wait period τ between said first and second ninety degree excitation pulses.

5. The NMR tool of claim 4, wherein said CPMG pulse sequence portion follows said two-dimensional line-narrowing sequence portion.

6. The NMR tool of claim 1, wherein said solid state pulse sequence portion includes a first ninety degree excitation pulse followed by a sub-sequence including a second ninety degree excitation pulse following said first ninety degree excitation pulse after a time period of $2τ+τ_p$, said second ninety degree excitation pulse followed after a time period τ by an 180 degree pulse of length $τ_p$, followed after a time period 2τ by three 180 degree pulses each spaced by a time period 2τ, and followed by another ninety degree excitation pulse.

7. The NMR tool of claim 6, wherein said CPMG pulse sequence portion follows said solid state pulse sequence portion, and said another ninety degree excitation pulse constitutes a beginning of said CPMG pulse sequence portion.

8. The NMR tool of claim 6, wherein said solid state pulse sequence portion is a two-dimensional line-narrowing sequence portion that comprises a repetition of said sub-sequence at least one time.

9. The NMR tool of claim 7, wherein said CPMG pulse sequence portion follows said two-dimensional line-narrowing sequence portion.

10. The NMR tool of claim 1, wherein said solid state pulse sequence portion includes a first ninety degree excitation pulse followed by a sub-sequence comprising a second ninety degree excitation pulse that follows said first ninety degree excitation pulse after a period of time $\tau$, followed after a period of time $\tau$ by a third ninety degree excitation pulse followed after a period of time $2\tau$ by a fourth ninety degree excitation pulse, followed after a period of time $\tau$ by a fifth ninety degree excitation pulse.

11. The NMR tool of claim 10, wherein said CPMG pulse sequence portion follows said solid state pulse sequence portion, and said fifth ninety degree excitation pulse constitutes a beginning of said CPMG pulse sequence portion.

12. The NMR tool of claim 10, wherein said solid state pulse sequence portion is a two-dimensional line-narrowing sequence portion that comprises a repetition of said sub-sequence at least one time.

13. The NMR tool of claim 12, wherein said CPMG pulse sequence portion follows said two-dimensional line-narrowing sequence portion.

14. The NMR tool of claim 1, wherein said solid state pulse sequence portion includes a first ninety degree excitation pulse followed by a sub-sequence including a second ninety degree excitation pulse following said first ninety degree excitation pulse after a period of time $\tau$, which is followed after a period of $4\tau$ during which time spin-locking +x and −x pulses are provided by another ninety degree excitation pulse.

15. The NMR tool of claim 14, wherein said CPMG pulse sequence portion follows said solid state pulse sequence portion, and said another ninety degree excitation pulse constitutes a beginning of said CPMG pulse sequence portion.

16. The NMR tool of claim 14, wherein said line-narrowing pulse sequence portion is a two-dimensional line-narrowing sequence portion that comprises a repetition of said sub-sequence at least one time.

17. The NMR tool of claim 16, wherein said CPMG pulse sequence portion follows said two-dimensional line-narrowing sequence portion.

18. The NMR tool of claim 1, wherein said pulse sequencer generates an NMR pulse sequence further including a $T_1$ pulse sequence and said processor further processes data resulting from said $T_1$ pulse sequence.

19. The NMR tool of claim 1, wherein said processor determines the hydrogen content in the solid portion of the sample by using said at least one echo that results from said solid state sequence portion to establish a total organic hydrogen content of the sample, and by using said train of echoes to establish a fluid organic hydrogen content, and by subtracting said fluid organic hydrogen content from said total organic hydrogen content to obtain said hydrogen content in the solid portion of the sample.

20. The NMR tool of claim 1, wherein said NMR tool includes a body in which said magnetic, said transmitter and said receiver are located and a cable coupled to said body.

21. A method of investigating a sample having a solid portion with a solid hydrogen content and a fluid portion with a fluid hydrogen content, comprising:
generating and subjecting the sample to an NMR field, said NMR field varying according to an NMR pulse sequence including a solid state pulse sequence portion and a CPMG pulse sequence portion having a plurality of pulses;
detecting signals resulting from an interaction of said NMR field with the sample, including at least one echo that results from said solid state pulse sequence portion and a train of echoes between pulses of said CPMG pulse sequence portion, wherein said at least one echo that results from said solid state pulse sequence portion is indicative of total hydrogen content of the sample including both the solid hydrogen content and the fluid hydrogen content of the sample, and wherein said train of echoes is indicative of the fluid hydrogen content of the sample; and
processing said at least one echo that results from said solid state pulse sequence portion and said train of echoes to determine the solid hydrogen content of the sample.

22. The method of claim 21, wherein said solid state pulse sequence portion includes one of (i) a first ninety degree excitation pulse followed after a wait period $\tau$ by a second ninety degree excitation pulse, (ii) a first ninety degree excitation pulse followed by a sub-sequence including a second ninety degree excitation pulse following said first ninety degree excitation pulse after a time period of $2\tau+\tau_p$, said second ninety degree excitation pulse followed after a time period $\tau$ by an 180 degree pulse of length $\tau_p$, followed after a time period $2\tau$ by three 180 degree pulses each spaced by a time period $2\tau$, and followed by another ninety degree excitation pulse, (iii) a first ninety degree excitation pulse followed by a sub-sequence comprising a second ninety degree excitation pulse that follows said first ninety degree excitation pulse after a period of time $\tau$, followed after a period of time $\tau$ by a third ninety degree excitation pulse followed after a period of time $2\tau$ by a fourth ninety degree excitation pulse, followed after a period of time $\tau$ by a fifth ninety degree excitation pulse, and (iv) a first ninety degree excitation pulse followed by a sub-sequence including a second ninety degree excitation pulse following said first ninety degree excitation pulse after a period of time $\tau$, which is followed after a period of $4\tau$ during which time spin-locking +x and −x pulses are provided by another ninety degree excitation pulse.

23. The method of claim 22, wherein said CPMG pulse sequence portion follows said solid state pulse sequence portion, and said second ninety degree excitation pulse constitutes a beginning of said CPMG pulse sequence portion.

24. The method of claim 22, wherein said solid state pulse sequence portion is a two-dimensional line-narrowing sequence portion.

25. The method of claim 24, wherein said CPMG pulse sequence portion follows said two-dimensional line-narrowing sequence portion.

26. The method of claim 21, wherein said solid state pulse sequence portion is a two-dimensional line-narrowing sequence portion, and said NMR pulse sequence further including a $T_1$ pulse sequence.

27. The method of claim 21, wherein said processing determines the solid hydrogen content of the sample by using said at least one echo that results from said solid state sequence portion to establish a total organic hydrogen content of the sample, and by using said train of echoes to establish the fluid organic hydrogen content of the sample, and by subtracting said fluid organic hydrogen content from said total organic hydrogen content to obtain said solid hydrogen content of the sample.

28. A method of investigating a sample having a solid portion with a solid hydrogen content and a fluid portion with a fluid hydrogen content, comprising:

generating and subjecting the sample to an NMR field, said NMR field varying according to an NMR pulse sequence including a two-dimensional line-narrowing pulse sequence portion and a CPMG pulse sequence portion having a plurality of pulses;

detecting signals resulting from an interaction of said NMR field with the sample, including a series of echoes resulting from said two-dimensional line-narrowing pulse sequence portion and a train of echoes between pulses of said CPMG pulse sequence portion, wherein said series of echoes is indicative of total hydrogen content of the sample including both the solid hydrogen content and the fluid hydrogen content of the sample, and wherein said train of echoes is indicative of the fluid hydrogen content of the sample; and processing said series of echoes and said train of echoes to determine the solid hydrogen content of the sample.

29. The method of claim 28, wherein said processing includes conducting a Laplace-Laplace inverse transform and finding line-narrowing $T_2$ values from said series of echoes and finding CPMG $T_2$ values from said train of CPMG echoes, said method further comprising: plotting a map said line-narrowing $T_2$ values versus said CPMG $T_2$ values; and identifying different hydrogen-containing species in the sample from the map.

30. The method of claim 28, wherein said processing include conducting a Fourier-Laplace transform and finding chemical shift values from said series of echoes and finding CPMG $T_2$ values from said train of CPMG echoes, said method further comprising: plotting a chemical shift-$T_2$ map; and identifying different hydrogen-containing species in the sample from the map.

31. The method of claim 28, wherein said NMR pulse sequence further includes a $T_1$ pulse sequence, and said method further comprises plotting a map with $T_1$ as one axis of the map.

32. The method of claim 28, wherein said processing determines the solid hydrogen content of the sample by using said series of echoes to establish a total organic hydrogen content of the sample, and by using said train of echoes to establish the fluid organic hydrogen content of the sample, and by subtracting said fluid organic hydrogen content from said total organic hydrogen content to obtain said solid hydrogen content of the sample.

* * * * *